United States Patent
Snyder et al.

(10) Patent No.: US 11,282,955 B2
(45) Date of Patent: Mar. 22, 2022

(54) LDMOS ARCHITECTURE AND METHOD FOR FORMING

(71) Applicant: Silanna Asia Pte Ltd, Singapore (SG)

(72) Inventors: David Snyder, Beaverton, OR (US); Shanghui Larry Tu, San Diego, CA (US)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 16/879,046

(22) Filed: May 20, 2020

(65) Prior Publication Data
US 2021/0367073 A1 Nov. 25, 2021

(51) Int. Cl.
| H01L 29/78 | (2006.01) |
| H01L 29/10 | (2006.01) |
| H01L 29/40 | (2006.01) |
| H01L 29/417 | (2006.01) |
| H01L 29/66 | (2006.01) |
| H01L 21/265 | (2006.01) |
| H01L 21/266 | (2006.01) |

(Continued)

(52) U.S. Cl.
CPC ...... *H01L 29/7824* (2013.01); *H01L 21/2253* (2013.01); *H01L 21/266* (2013.01); *H01L 21/26513* (2013.01); *H01L 21/26586* (2013.01); *H01L 21/765* (2013.01); *H01L 29/1095* (2013.01); *H01L 29/402* (2013.01); *H01L 29/41725* (2013.01); *H01L 29/66681* (2013.01)

(58) Field of Classification Search
CPC ............. H01L 29/7824; H01L 21/2253; H01L 21/26513; H01L 21/26586; H01L 21/266; H01L 21/765; H01L 29/1095; H01L 29/402; H01L 29/41725; H01L 29/66681
See application file for complete search history.

(56) References Cited

U.S. PATENT DOCUMENTS

| 5,985,743 A | 11/1999 | Gardner |
| 2004/0089897 A1 | 5/2004 | Johansson et al. |
| 2008/0182394 A1 | 7/2008 | Yang et al. |

(Continued)

FOREIGN PATENT DOCUMENTS

KR 1020070071030 A 7/2007

OTHER PUBLICATIONS

International Search Report and Written Opinion dated Aug. 6, 2021 for PCT Patent Application No. PCT/IB2021/053764.

*Primary Examiner* — Mohammed R Alam
(74) *Attorney, Agent, or Firm* — MLO, a professional corp.

(57) ABSTRACT

A method for forming a semiconductor device involves providing a semiconductor wafer having an active layer of a first conductivity type. First and second gates having first and second gate polysilicon are formed on the active layer. A first mask region is formed on the active layer. Between the first and second gates, using the first mask region, the first gate polysilicon, and the second gate polysilicon as a mask, a deep well of a second conductivity type, a shallow well of the second conductivity type, a source region of the first conductivity type, and first and second channel regions of the second conductivity type, are formed. In the active layer, using one or more second mask regions, first and second drift regions of the first conductivity type, first and second drain regions of the first conductivity type, and a source connection region of the second conductivity type, are formed.

19 Claims, 21 Drawing Sheets

(51) Int. Cl.
*H01L 21/765* (2006.01)
*H01L 21/225* (2006.01)

(56) References Cited

U.S. PATENT DOCUMENTS

| | | |
|---|---|---|
| 2012/0094457 A1 | 4/2012 | Gabrys |
| 2015/0084126 A1 | 3/2015 | Jung et al. |
| 2015/0206968 A1 | 7/2015 | Cascino et al. |
| 2017/0162690 A1* | 6/2017 | Edwards ............. H01L 29/7816 |
| 2018/0090613 A1* | 3/2018 | McGregor ........ H01L 29/41766 |
| 2020/0091340 A1 | 3/2020 | Snyder |

\* cited by examiner

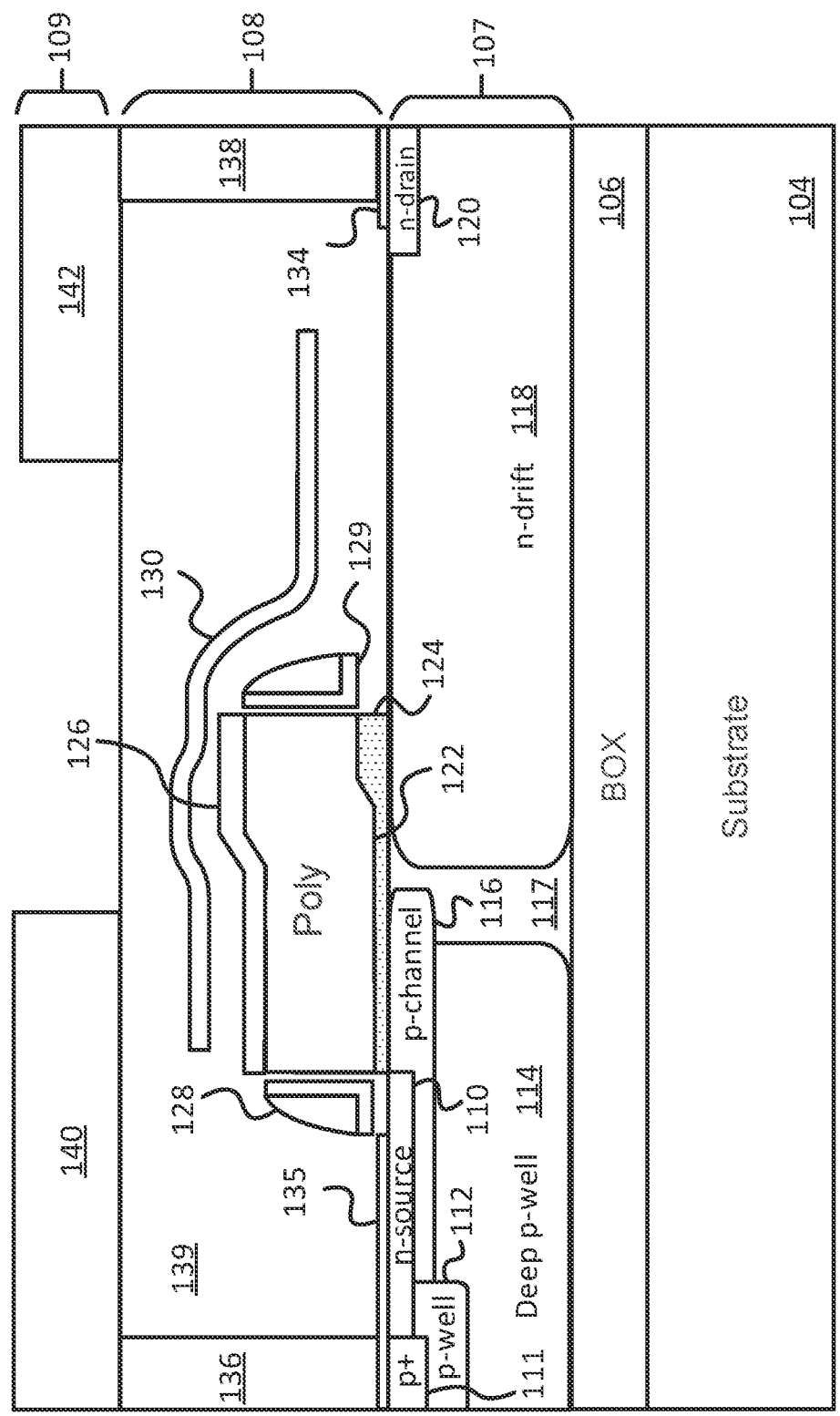

LDMOS ARCHITECTURE AND METHOD FOR FORMING

BACKGROUND

Metal-oxide field effect transistors (MOSFETs) generally include a polysilicon gate, a source region, a drain region, and a channel region. The source region and the drain region are of a first conductivity type, and the channel region is of a second conductivity type. In some MOSFET devices, the first conductivity type is an n-type conductivity and the second conductivity type is a p-type conductivity. In other MOSFET devices, this relationship is reversed. When a MOSFET device is in an on-state, in response to an applied gate voltage, current flows between the drain region and the source region via the channel region. When the MOSFET device is in an off-state, current does not flow between the drain region and the source region so long as a reverse-bias voltage across the MOSFET does not exceed a breakdown voltage level. If the reverse-bias voltage exceeds the breakdown voltage, a large uncontrolled current may flow between the source region and the drain region regardless of whether a voltage is applied to the gate. As the reverse-bias voltage increases above the breakdown voltage, an avalanche breakdown event can occur. During the avalanche breakdown event, current through the MOSFET increases at an increasing rate and can quickly exceed a maximum current rating of the MOSFET, possibly damaging or destroying the MOSFET.

Lateral diffusion MOSFETs (LDMOS) are a class of MOSFETs that additionally include a lateral drift drain (LDD) region to increase breakdown voltage as compared to the breakdown voltage of a typical MOSFET. The LDD region allows the LDMOS to withstand greater voltages in the off-state by absorbing portions of the electric field that would otherwise cause the MOSFET to breakdown.

SUMMARY

In some examples, a method for forming a semiconductor device involves providing a semiconductor wafer having a substrate layer, and an active layer of a first conductivity type. A first gate is formed on the active layer, the first gate including first gate polysilicon. A second gate is formed on the active layer, the second gate being laterally disposed from the first gate and including second gate polysilicon. A first mask region is formed on the active layer. In the active layer between the first gate and the second gate using the first mask region, the first gate polysilicon, and the second gate polysilicon as a mask, a deep well of a second conductivity type, a shallow well of the second conductivity type, a source region of the first conductivity type, and a channel region segmented into a first channel region of the second conductivity type, and a second channel region of the second conductivity type are formed. In the active layer, using one or more second mask regions, a first drift region of the first conductivity type, a second drift region of the first conductivity type, a first drain region of the first conductivity type, a second drain region of the first conductivity type, and a source connection region of the second conductivity type are formed.

In some examples, a semiconductor device includes a semiconductor wafer having an active layer of a first conductivity type. The active layer includes a deep well of a second conductivity type, a shallow well of the second conductivity type, a source region of the first conductivity type, a first channel region of the second conductivity type, a second channel region of the second conductivity type, a first drift region of the first conductivity type, a second drift region of the first conductivity type, a first drain region of the first conductivity type, a second drain region of the first conductivity type, and a source connection region of the second conductivity type. The semiconductor device includes first gate polysilicon formed above the active layer. A first polysilicon gate spacer is laterally disposed next to the first gate polysilicon. The semiconductor device includes second gate polysilicon formed above the active layer. A second polysilicon gate spacer is laterally disposed next to the second gate polysilicon. The source connection region is laterally disposed between the first polysilicon gate spacer and the second polysilicon gate spacer. A first gate shield is formed above the first gate polysilicon. A second gate shield is formed above the second gate polysilicon. A dielectric region is formed over the active layer. The semiconductor device includes a metal source contact extending vertically from a top surface of the dielectric region to the source connection region, the metal source contact being laterally disposed between the first polysilicon gate spacer and the second polysilicon gate spacer and having a first width along a first vertical extent of the metal source contact that is wider than a second width along a second vertical extent of the metal source contact, the first width of the first vertical extent of the metal source contact laterally overlapping, and being in contact with, the first gate shield.

BRIEF DESCRIPTION OF THE DRAWINGS

FIG. 1 is a simplified cross-section diagram of an example LDMOS device, in accordance with some embodiments.

DETAILED DESCRIPTION

Figure 2A:
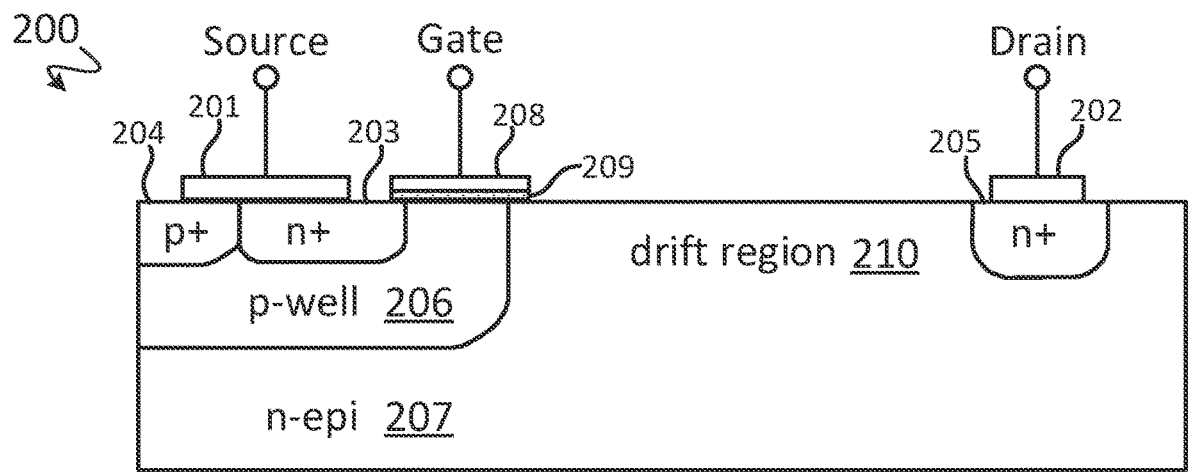
FIGS. 2A-2B are prior art examples of LDMOS devices.

A lightly doped drain (LDD) region of a lateral diffusion metal-oxide field effect transistor (LDMOS) provides the LDMOS device with an increased breakdown voltage, as compared to other Metal-oxide field effect transistors (MOSFETs) not having an LDD region, at the expense of increasing an on-resistance of the LDMOS device. The conductivity of the LDD region and the length of the LDD region are each respectively proportional to the impedance of the region in the direction of current flow. Thus, increasing the breakdown voltage of the LDMOS device can be achieved by decreasing the doping level of the LDD region or by extending the lateral extent of the LDD. This interrelationship presents a difficult design problem because it is often desirable to keep the on-state resistance of the LDMOS device low or the LDMOS device will burn a significant amount of power when it sinks large currents that power devices, such as LDMOS devices, frequently conduct.

Disclosed herein is a semiconductor structure that includes at least one LDMOS device, either having a single finger or multiple fingers, that advantageously improves several key features as compared to conventional LDMOS devices. These features include an increased robustness to process variation, an increased stability related to high electric fields and breakdown conditions, a lower resistance connection to a channel region of the LDMOS device for source/drain current, and/or an increased ruggedness in handling avalanche generated minority carriers. Additional benefits of the LDMOS devices disclosed herein, as compared to conventional LDMOS devices, include a reduction in specific Rdson or Rsp due to a compactness of a source region of the LDMOS device, an increased ease of manufacturability, and/or a lower wafer cost.

A portion of a cross-section of a laterally diffused MOS-FET (LDMOS) device 102 having a device architecture that significantly improves device performance and reduces manufacturing variation, as compared to a conventional LDMOS device, is shown in FIG. 1, in accordance with some embodiments. Some elements of the LDMOS device 102 have been omitted from FIG. 1 to simplify the description of LDMOS device 102. In general, the LDMOS device 102 is a Silicon on Insulator (SOI) device that includes a semiconductor wafer that includes a substrate 104, a buried oxide (BOX) layer 106 (e.g., $SiO_2$) on the substrate 104, and an active layer 107 on the BOX layer 106. A gate and contact layer 108 is on the active layer 107, and a metallization layer (i.e., top metal) 109 is on the gate and contact layer 108.

As described herein, a first layer that is "on" or is "formed on" a second layer is formed, adhered to, or disposed on at least a portion of the second layer. In general, at least a portion of a lowest vertical extent of the first layer is in direct contact with at least a portion of highest vertical extent of the second layer, or is in direct contact with a bonding material such as an adhesive or solder that connects the first layer to the second layer. For example, the active layer 107 of the LDMOS device 102 is above the substrate 104 but not "on" the substrate 104. Rather, the active layer 107 of the LDMOS device 102 is formed "on" the BOX layer 106. In some embodiments, a bonding element, such as a chemical adhesive or solder, may intervene between the first layer that is formed on the second layer.

For an n-type LDMOS device, the active layer 107 generally includes n-type conductivity silicon 117, an n-type conductivity source region 110, a p-type conductivity source connection region 111, a p-type conductivity shallow well 112, a p-type conductivity deep well 114, a p-type conductivity channel region 116, an n-type conductivity drift region 118 (i.e., an LDD region), and an n-type conductivity drain region 120. For a p-type LDMOS device, the region conductivity types are reversed. The gate and contact layer 108 generally includes a gate oxide layer 124, gate polysilicon 122, a first portion of a metal source contact 135, a first portion of a metal drain contact 134, polysilicon gate spacers 128, 129, a gate contact 126, a gate shield 130, a second portion of the metal source contact 136, a second portion of the metal drain contact 138, and dielectric 139. The metallization layer 109 generally includes a third portion of the metal source contact 140, and a third portion of the metal drain contact 142.

A source architecture that includes the source region 110, the channel region 116, the shallow well 112, the deep well 114, and the source connection region 111, as disclosed herein, advantageously provides a stable electrical plane from which the gate, drift, and drain regions of the LDMOS device 102 operate under a wide range of bias conditions. This source architecture is advantageously formed using an example process 1500, as disclosed herein, that limits variation of important source-controlled electrical parameters like Vt and Ioff. As compared to source architectures of conventional LDMOS devices, the source architecture of the LDMOS device 102 advantageously provides increased snapback and unclamped inductive switching (UIS) ruggedness, a lower source resistance presented to current when the LDMOS device 102 is on, and a lower source leakage current when the LDMOS device 102 is off. The gate shield 130 advantageously reduces a capacitive coupling of the gate polysilicon 122 to metallization of the drain region 120. Additionally, the example process 1500 for forming the LDMOS device 102, as disclosed herein, involves forming the channel region 116, the shallow well 112, the deep well 114, and the source region 110 using a single photo masking step. Thus, the process 1500 advantageously reduces a total number of photo masking steps as compared to a conventional process for forming a conventional LDMOS device in which each of the aforementioned regions are processed at a separate photo masking step.

The drain region 120 is configured to receive a bias voltage (not shown), and the gate polysilicon 122 controls inversion/depletion of the channel region 116 to control a current flow between the drain region 120 and the source region 110 via the drift region 118 and the channel region 116. The channel region 116 provides p-type doping in the active layer 107 under the gate polysilicon 122. The doping and lateral extent of the channel region 116 contributes to producing a desired Vt of the LDMOS device 102 and affects other parameters of the LDMOS device 102, such as Rsp, Ids, Ioff, and Gm. The deep well 114 provides heavy p-type doping below the source region 110. As such, the deep well 114 advantageously contributes to weakening a source-side parasitic bipolar transistor so that snapback and UIS of the LDMOS device 102 meet application requirements. The source region 110 is heavily doped and is shallower than that of a conventional LDMOS device to allow the deep well 114 to advantageously collect avalanche generated minority carriers efficiently without the source-side parasitic bipolar transistor turning on.

Implant conditions of the source region 110, the channel region 116, the deep well 114, and the shallow well 112 are such that dopants do not penetrate through a thickness of the gate polysilicon 122. This has the effect of doping the active layer 107 based on where the gate polysilicon 122 has been etched off of the active layer 107. In the case of the channel region 116, dopant species are implanted at an angle and penetrate through an edge of the gate polysilicon 122 to form the channel region 116. Introducing dopants into the active layer 107 in this way advantageously eliminates processing variation to misalignment or critical dimension control of photoresist as compared to a conventional process for forming a conventional LDMOS device. As such, the LDMOS device 102, formed using the process 1500 as disclosed herein, advantageously includes i) a repeatable length (i.e., a lateral extent) of the channel region 116 under the gate polysilicon 122, thereby removing a significant source of variation amongst electrical parameters of the LDMOS device 102, ii) a deep well 114 that is aligned directly under the source region 110, thereby enabling stable UIS and snapback performance of the LDMOS device 102 that does not vary between opposing fingers of a multi-finger LDMOS device, and iii) a source region 110 that is implanted at an edge of the gate polysilicon 122 and thermally driven under a controlled distance, thereby advantageously providing a good connection of the source region 110 to a channel inversion layer, thereby improving a source to drain current level, Ids, of the LDMOS device 102, as compared to a conventional LDMOS device.

FIG. 2A shows a basic prior art LDMOS device 200, which includes a source contact 201, a drain contact 202, an n+ source region 203, a p+ source contact region 204, an n+ drain region 205, a p-well 206, an n-epi region 207, a gate 208, and gate oxide 209. The p-well 206 forms a body region, and a channel region is formed in a portion of the body region beneath the gate 208. The n-epi region 207 includes an n-drift region 210 near the top surface thereof between the p-well 206 and the n+ drain region 205.

The prior art LDMOS device 200 has several disadvantages in comparison with the LDMOS device 102. For example, high voltages in a junction area between the channel region formed in the p-well 206 and the n-drift region 210 generally lead to a relatively low breakdown voltage compared to a breakdown voltage BVdss achieved with the improved design of the LDMOS device 102.

Figure 2B:
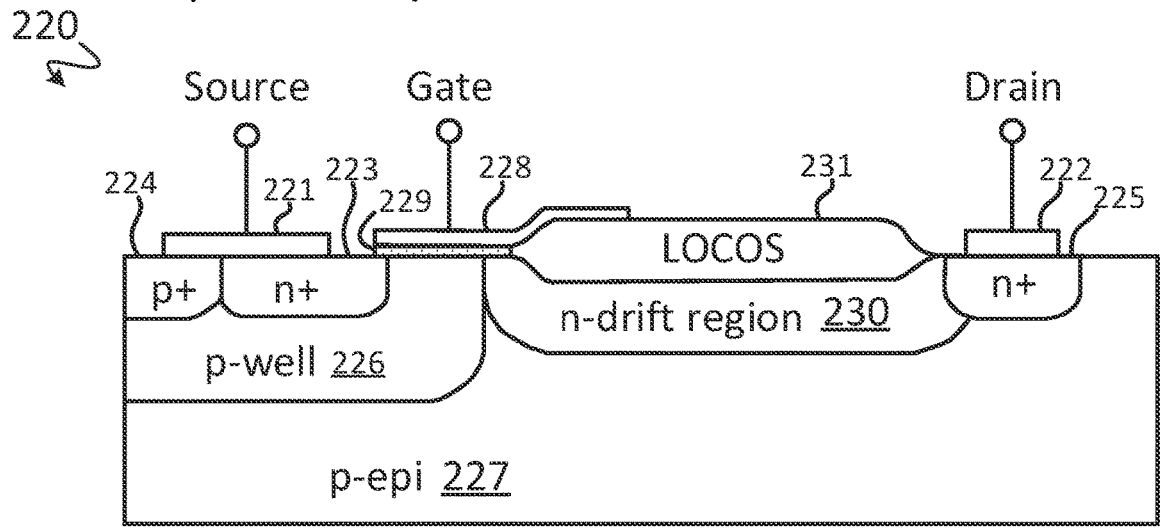

FIG. 2B shows another prior art LDMOS device 220, which includes a source contact 221, a drain contact 222, an n+ source region 223, a p+ source connection region 224, an n+ drain region 225, a p-well region 226, a p-epi region 227, a gate 228, gate oxide 229, an n-drift region 230, and a local oxidation of silicon (LOCOS) isolation region 231. The p-well region 226 forms a body region, and a channel region is formed in a portion of the body region beneath the gate 228. The n-drift region 230 is implanted in the p-epi region 227, and the LOCOS isolation region 231 is formed on the n-drift region 230. A portion of the gate 228 extends as a field plate over the LOCOS isolation region 231. The prior art LDMOS device 220 is a higher voltage device than the LDMOS device 200. To realize higher voltage capability, the n-drift region 230 must be lengthened and/or the n-drift region 230 doping must be reduced. The LOCOS isolation region 231 reduces the n-drift region 230 doping. Moving the n+ drain region 225 further from the p-well region 226 is necessary in such designs because the silicon of the LDMOS device 220 can handle ~30 V/um before avalanche breakdown occurs. In conventional LDMOS devices, 15 to 20 V/um is a typical avalanche limit. Consequently, to increase BVdss, Rsp is necessarily increased in such designs.

Figure 3:
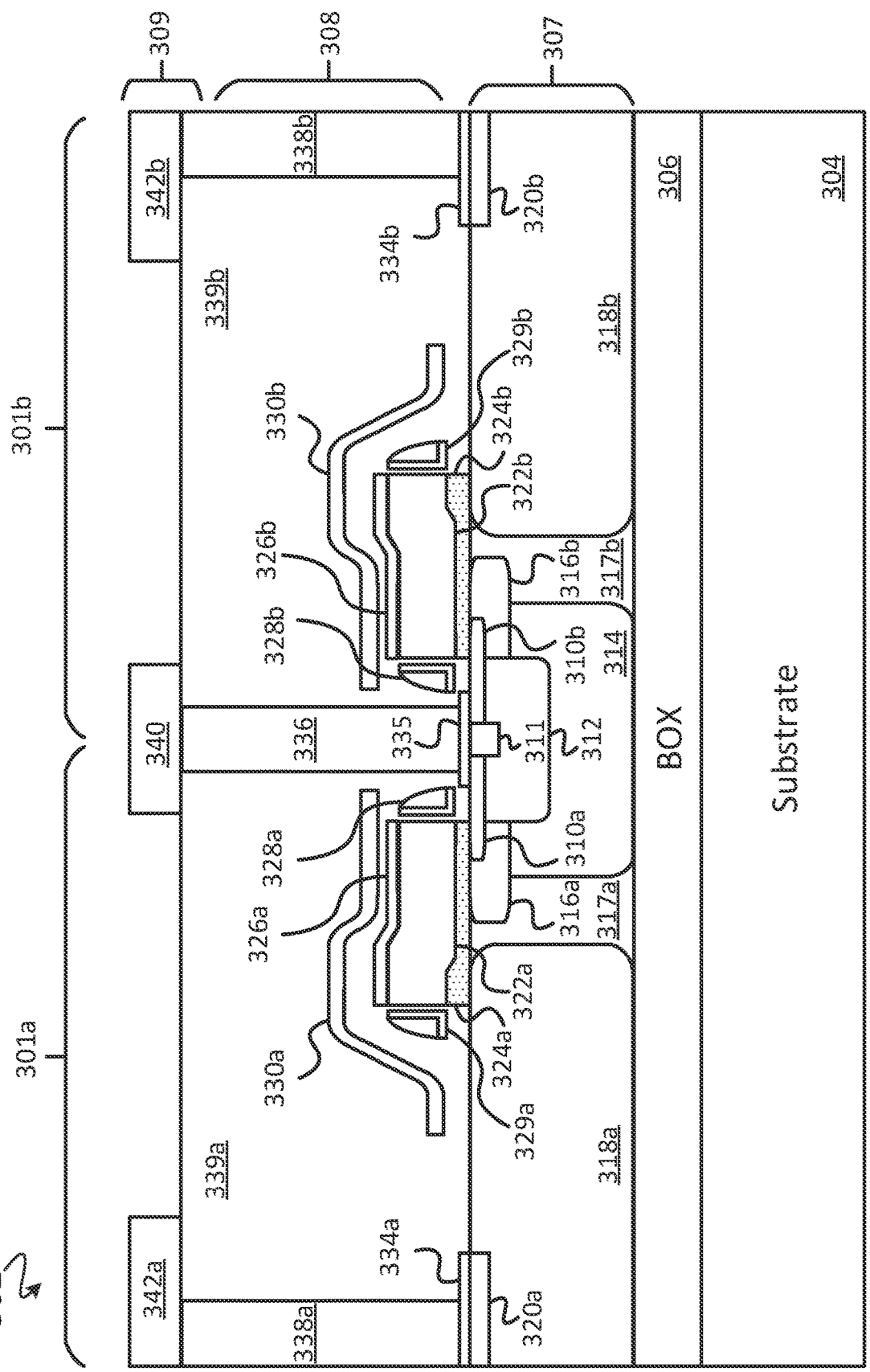
FIG. 3 is a simplified cross-section diagram of an example LDMOS device, in accordance with some embodiments.

A cross-section of a multi-finger LDMOS device 302 is shown in FIG. 3, in accordance with some embodiments. In some embodiments, the LDMOS device 302 generally includes two fingers 301a, 301b, each finger being similar to, or the same as the LDMOS device 102. In other embodiments, the LDMOS device 302 includes more than two fingers. In general, the LDMOS device 302 includes a substrate 304, a BOX layer 306 on the substrate 304, an n-type active layer 307 on the BOX layer 306, a gate and contact layer 308 on the active layer 307, and a metallization layer 309 on the gate and contact layer 308.

The LDMOS device 302 is described herein as an n-type LDMOS device having n-type conductivity ("n-type") regions and p-type conductivity ("p-type") regions. However, the LDMOS device 302 can instead be implemented as a p-type LDMOS device, whereupon the conductivity of the respective regions is swapped (i.e., an n-type region becomes a p-type region).

Some regions of the active layer 307 are shared between the fingers 301a, 301b. The regions of the active layer 307 shared between the fingers 301a-b include a heavily doped p-type source connection region 311, a p-type shallow well 312, and a p-type deep well 314. A first portion of the active layer 307 that is specific to the first finger 301a includes a first region of n-type silicon 317a, a first n-type source region 310a, a first p-type channel region 316a, a first n-type drift region 318a (i.e., an LDD region), and a first n-type drain region 320a. A second portion of the active layer 307 that is specific to the second finger 301b includes a second region of n-type silicon 317b, a second n-type source region 310b, a second p-type channel region 316b, a second n-type drift region 318b (i.e., an LDD region), and a second n-type drain region 320b.

Some elements of the gate and contact layer 308 are shared between the fingers 301a-b. The elements shared between the fingers 301a-b include a first portion of a metal source contact 335 and a second portion of the metal source contact 336. A first portion of the gate and contact layer 308 that is specific to the first finger 301a includes a first gate oxide layer 324a, a first gate polysilicon 322a, first polysilicon gate spacers 328a, 329a, a first gate contact 326a, a first gate shield 330a, a first portion of a first metal drain contact 334a, a second portion of the first metal drain contact 338a, and first dielectric 339a. A second portion of the gate and contact layer 308, that is specific to the second finger 301b, includes a second gate oxide layer 324b, a second gate polysilicon 322b, second polysilicon gate spacers 328b, 329b, a second gate contact 326b, a second gate shield 330b, a first portion of a second metal drain contact 334b, a second portion of the second metal drain contact 338b, and second dielectric 339b. The metallization layer 309 generally includes a third portion of the metal source contact 340 that is shared between the fingers 301a, 301b, a third portion of the first metal drain contact 342a, and a third portion of the second metal drain contact 342b. Advantages of the LDMOS device 302 as compared to a conventional LDMOS device are similar to, or the same as, those described with reference to the LDMOS device 102.

FIGS. 4-14 are simplified cross-section schematic views detailing steps for forming the LDMOS device 102 or 302 at various stages of an example process 1500, in accordance with some embodiments. Details of FIGS. 4-14 are briefly introduced below and then discussed in detail with reference to FIGS. 15-18 and FIGS. 19A-19B.

Figure 4:
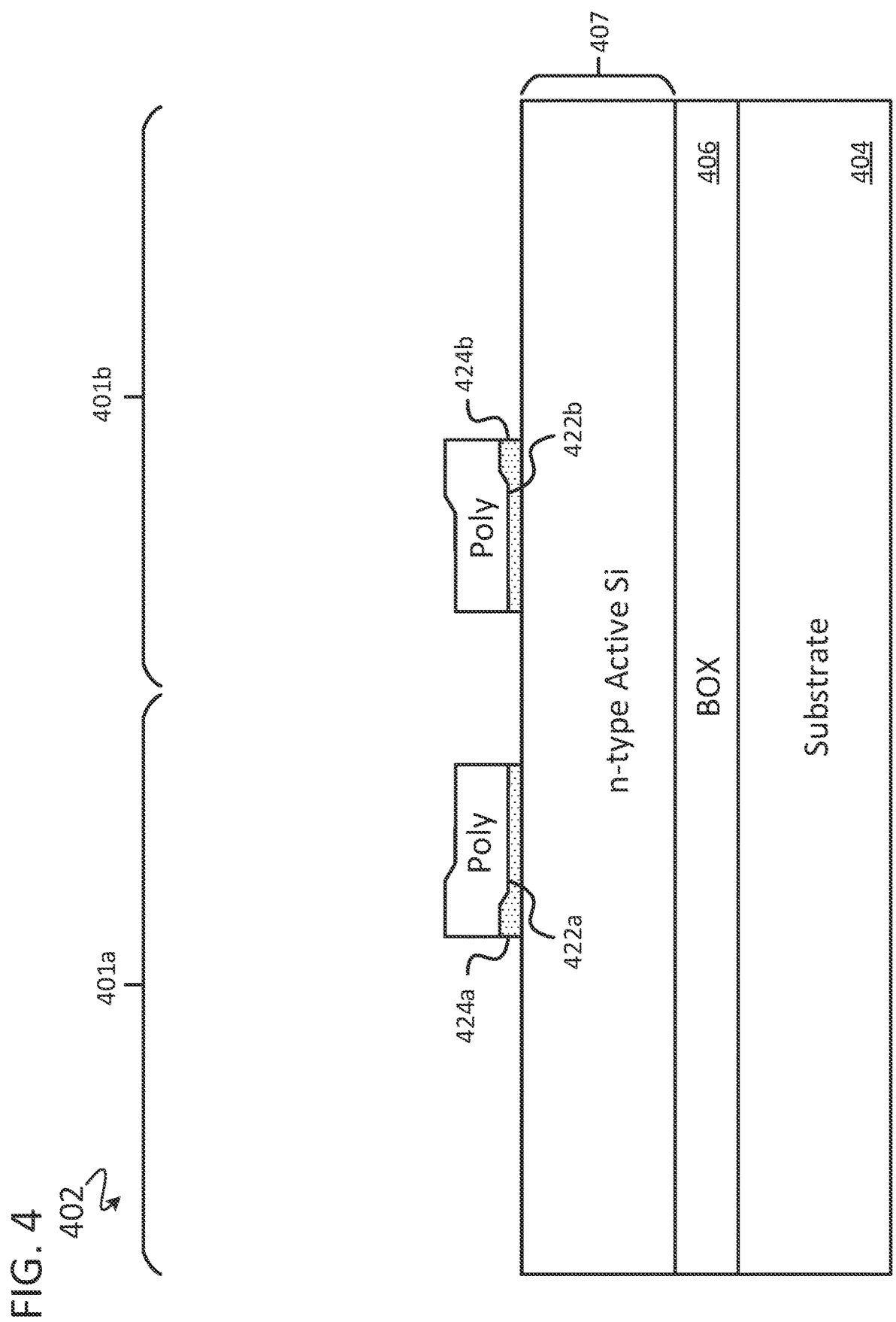
FIGS. 4-14 are simplified cross-section diagrams detailing an example process for forming the LDMOS device shown in FIG. 3, in accordance with some embodiments.

FIG. 4 is a simplified cross-section of a schematic view of a first step in the formation of an LDMOS device 402 that is the same as, or is similar to, the LDMOS devices 102, 302, in accordance with some embodiments. The LDMOS device 402 includes first and second portions of respective first and second fingers 401a, 401b. Regions and elements of the LDMOS device 402 designated by 'a' are understood to be part of the first finger 401a. Regions and elements of the LDMOS device 402 designated by 'b' are understood to be part of the second finger 401b. Regions and elements of the LDMOS device 402 that not designated by 'a' or 'b' are understood to be shared by the two fingers 401a, 401b. In some embodiments, the LDMOS device 402 formed by the process 1500 can have one finger, two fingers, or more than two fingers.

Regions of the LDMOS device 402 generally include a substrate layer 404, a buried oxide (BOX) layer 406 formed on the substrate layer 404, and an n-type silicon active layer 407 formed on the BOX layer 406. A first gate, of the first finger 401a, includes gate oxide 424a and gate polysilicon 422a formed on the active layer 407. A second gate, of the second finger 401b, includes gate oxide 424b and gate polysilicon 422b formed on the active layer 407 and laterally disposed from the gate oxide 424a and the gate polysilicon 422a. In some embodiments, the LDMOS device 402 includes shallow trench isolation structures (STI) (not shown) and deep trench isolation structures (DTI) (not shown) formed in the active layer 407 to provide isolation and/or termination between the LDMOS device 402 and other semiconductor structures formed on the box 406.

Figure 5:
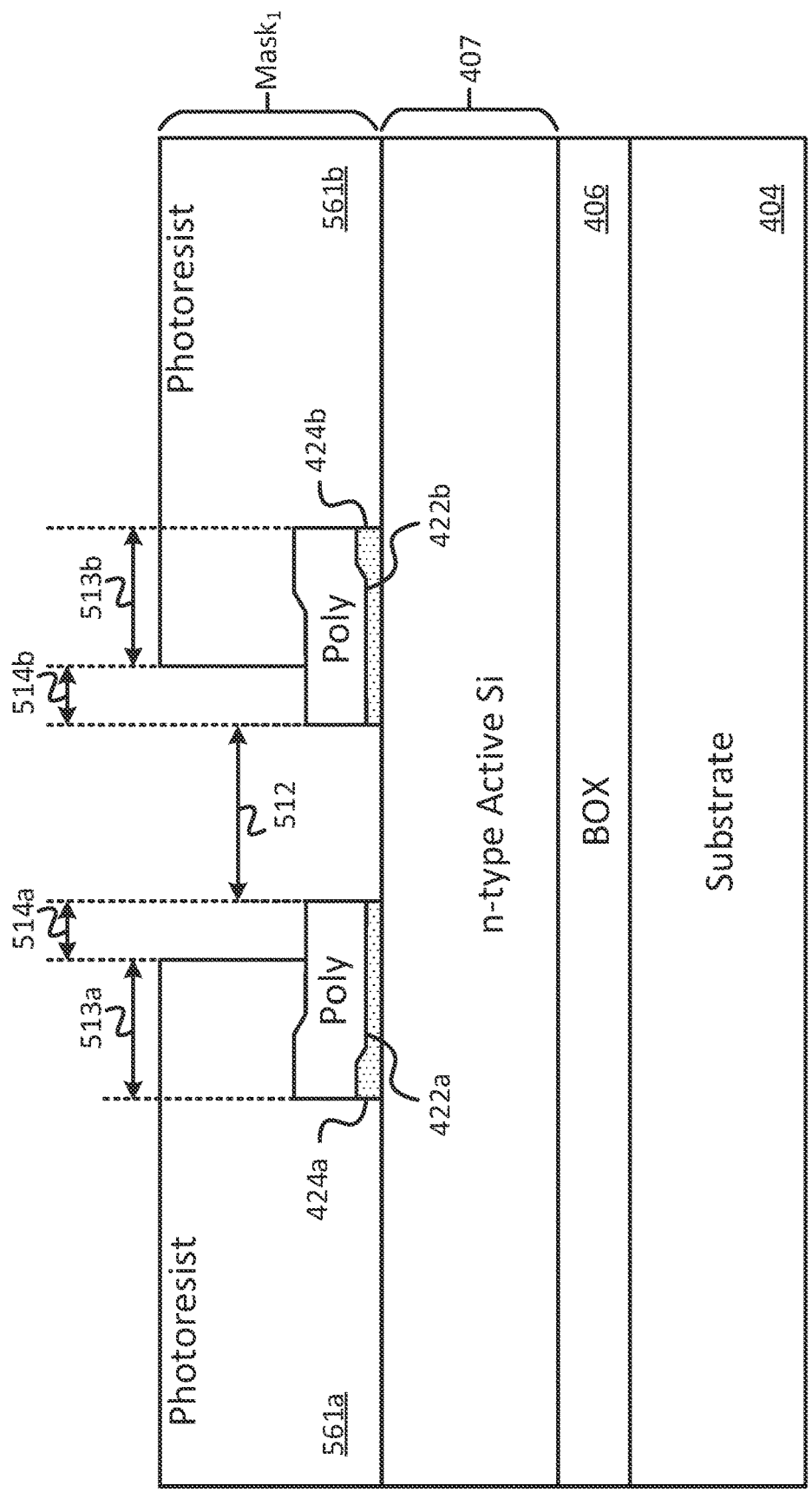

FIG. 5 illustrates the LDMOS device 402 after a first mask "Mask$_1$" has been formed on the active layer 407. The first mask Mask$_1$ includes photoresist regions 561a, 561b that are formed on the active layer 407 as part of the example process 1500, in accordance with some embodiments. Also shown is a lateral extent 512 of the active layer 407 that is exposed (i.e., has no photoresist or gate polysilicon disposed thereon), a first lateral extent 513a of the gate polysilicon 422a, a second lateral extent 514a of the gate polysilicon 422a, a first lateral extent 513b of the gate polysilicon 422b, and a second lateral extent 514b of the gate polysilicon 422b.

As shown, the first photoresist region 561a is formed on the first lateral extent 513a of the first gate polysilicon 422a and excludes (i.e., is not formed on) both the second lateral extent 514a of the gate polysilicon 422a and the exposed lateral extent 512 of the active layer 407. Similarly, the second photoresist region 561b is formed on the first lateral extent 513b of the second gate polysilicon 422b and excludes (i.e., is not formed on) both the second lateral extent 514b of the gate polysilicon 422b and the exposed lateral extent 512 of the active layer 407. In some embodiments, the lateral extent 512 may be selected based on design rules (e.g., gate polysilicon to source contact spacing), desired operational parameters, and/or manufacturing capabilities, the lateral extents 513a-b may be selected based on desired performance criteria of the LDMOS device 402 such as IDsat and hot carrier robustness, and the lateral extents 514a-b may be selected based on a desired alignment criteria of the photoresist regions 561a-b to the gate polysilicon 422a-b.

Figure 6:
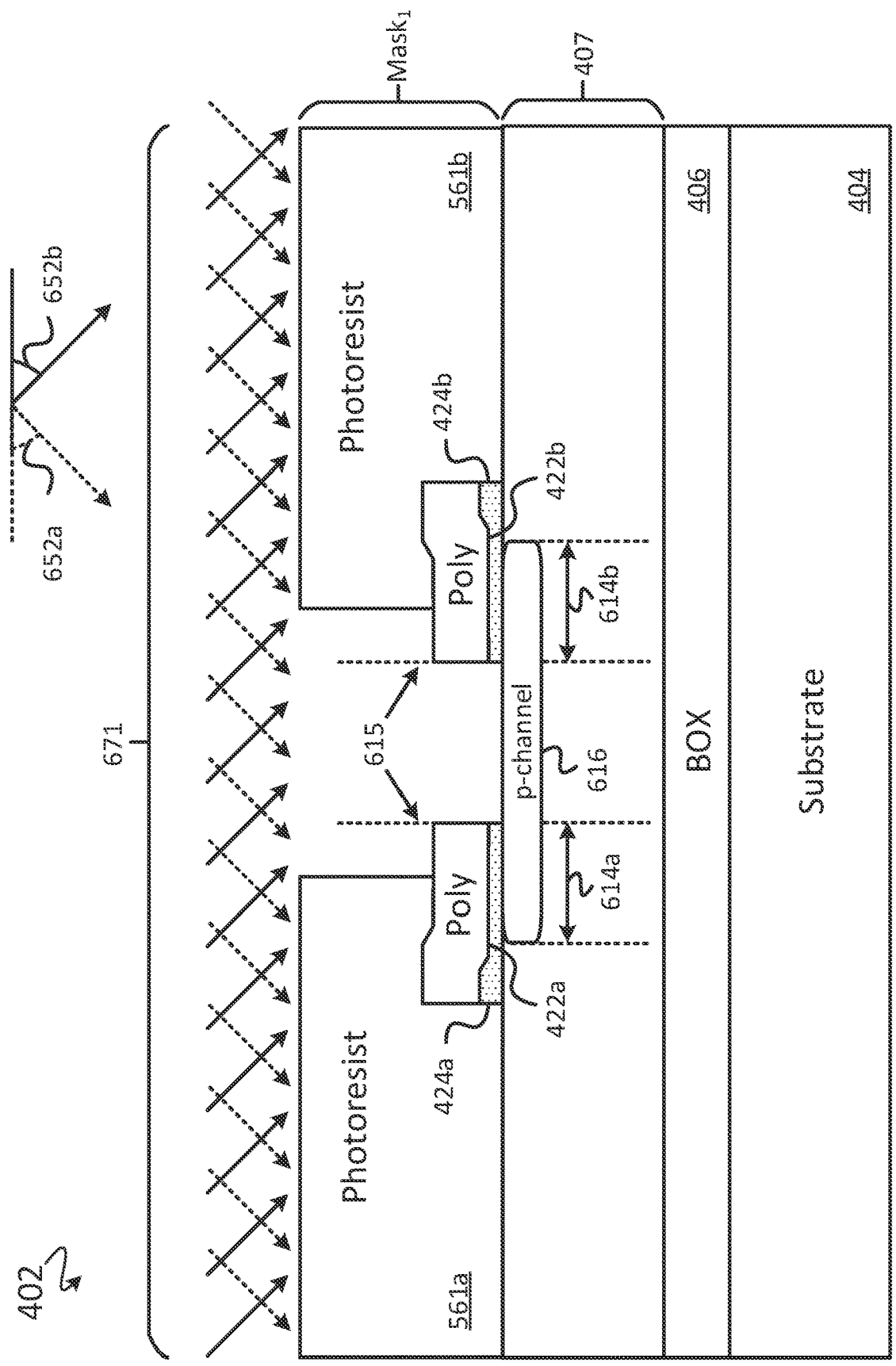

FIG. 6 illustrates formation of a p-type channel region 616 in the active layer 407 by dopants 671 implanted at a first range of tilt angles 652a (shown as dashed arrows) and implanted at a second range of tilt angles 652b (shown by solid arrows), using the photoresist regions 561a, 561b and the gate polysilicon 422a, 422b as a mask to form the channel region 616. Implant conditions of the channel region 616 are such that dopants do not penetrate through a thickness of the gate polysilicon 422a, 422b. The channel region 616 extends laterally beneath the gate polysilicon 422a by a first lateral extent 614a. Similarly, the channel region 616 extends laterally beneath the gate polysilicon 422b by a second lateral extent 614b.

In some embodiments, the dopants 671 are p-type dopants that include Boron. Boron implant conditions of the dopants 671 depend on a thickness of the gate oxides 424a-b and a desired channel length of the channel region 616 (e.g., a desired respective length of the lateral extents 614a-b. For example, in some embodiments, for a gate oxide thickness of the gate oxides 424a-b of 70 Angstroms, an implant dose of the dopants 671 may range from 1e13 B/cm$^2$ to 7e13 B/cm$^2$, depending on an extent to which other dopants of the LDMOS device 402 affect the doping of the channel region 616. In some embodiments, the range of tilt angles 652a-b range from 7 degrees to 45 degrees (from a plane perpendicular to a horizontal plane that is parallel to a top surface of the active layer 407) and may be selected as appropriate for a desired lateral extent 614a-b of the channel region 616. A shallower tilt angle (e.g., 7 degrees) of the range of tilt angles 652a-b will create a shorter channel length of the channel region 616 than a greater tilt angle (e.g., 45 degrees).

Figure 7:
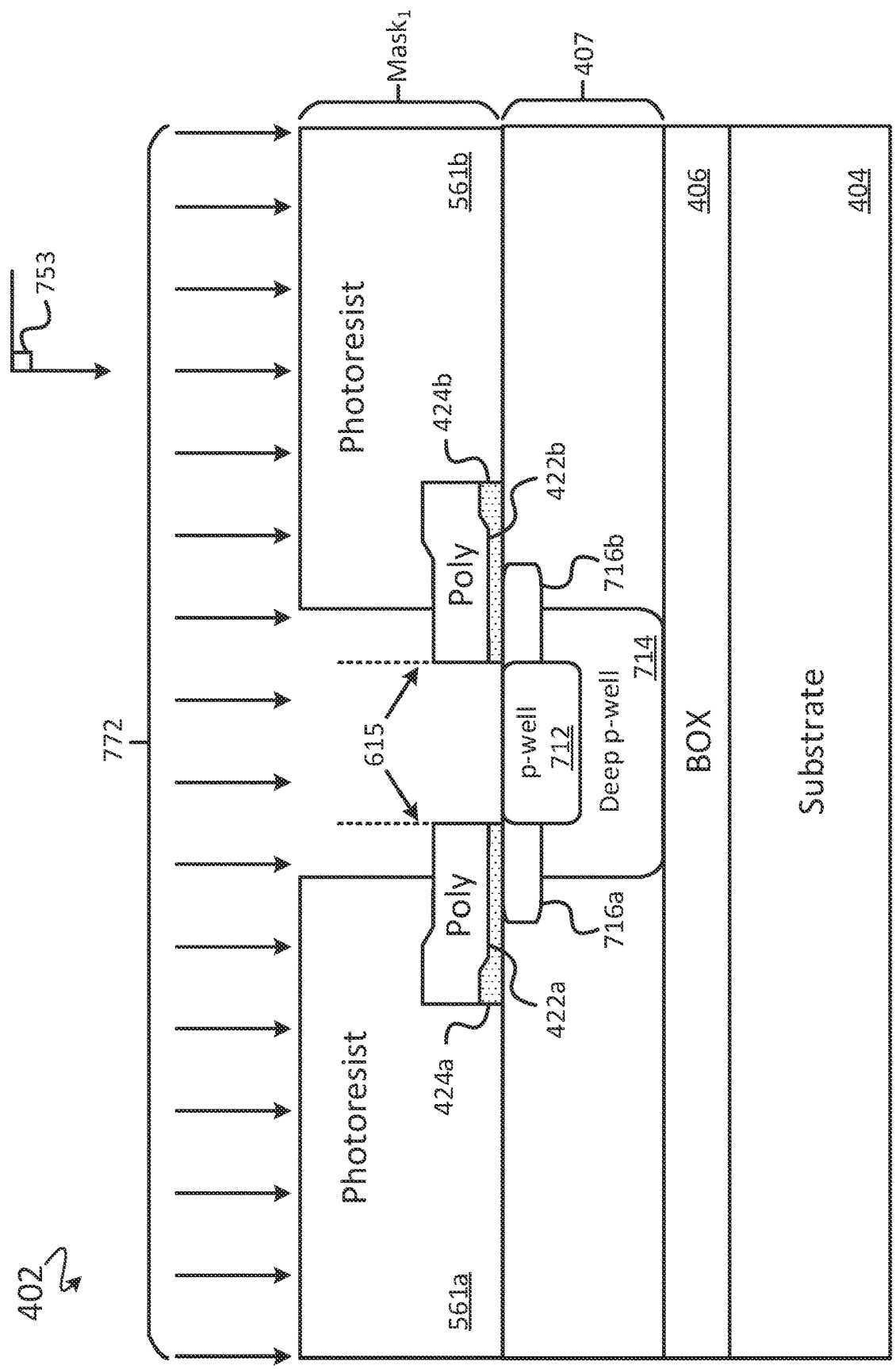

FIG. 7 illustrates the LDMOS device 402 after formation of a p-type shallow well 712 and a p-type deep well 714 in the active layer 407 by dopants 772 implanted at a tilt angle 753, using the photoresist regions 561a, 561b and the gate polysilicon 422a, 422b as a mask (i.e., Mask$_1$), in accordance with some embodiments. The p-type shallow well 712 and the p-type deep well 714 convert the implanted regions of the n-type active silicon of the active layer 407 into p-type silicon, thereby forming the LDMOS device 402 such that it exhibits desirable snapback and UIS performance. As shown, the channel region 616 shown in FIG. 6 is now segmented by the wells 712, 714 into p-type channel regions 716a, 716b. Similar to the channel region 616, implant conditions of the wells 712, 714 are such that dopants do not penetrate through a thickness of the gate polysilicon 422a, 422b. In some embodiments, the tilt angle 753 is perpendicular to a horizontal plane that is parallel to a top surface of the active layer 407, in other embodiments, the tilt angle 753 ranges from 70 degrees to 120 degrees from the horizontal plane that is parallel to the top surface of the active layer 407. In some embodiments, the dopants 772 are p-type dopants that include Boron and are implanted at a concentration ranging from 1e13 B/cm$^2$ to 7e13 B/cm$^2$.

Figure 8:
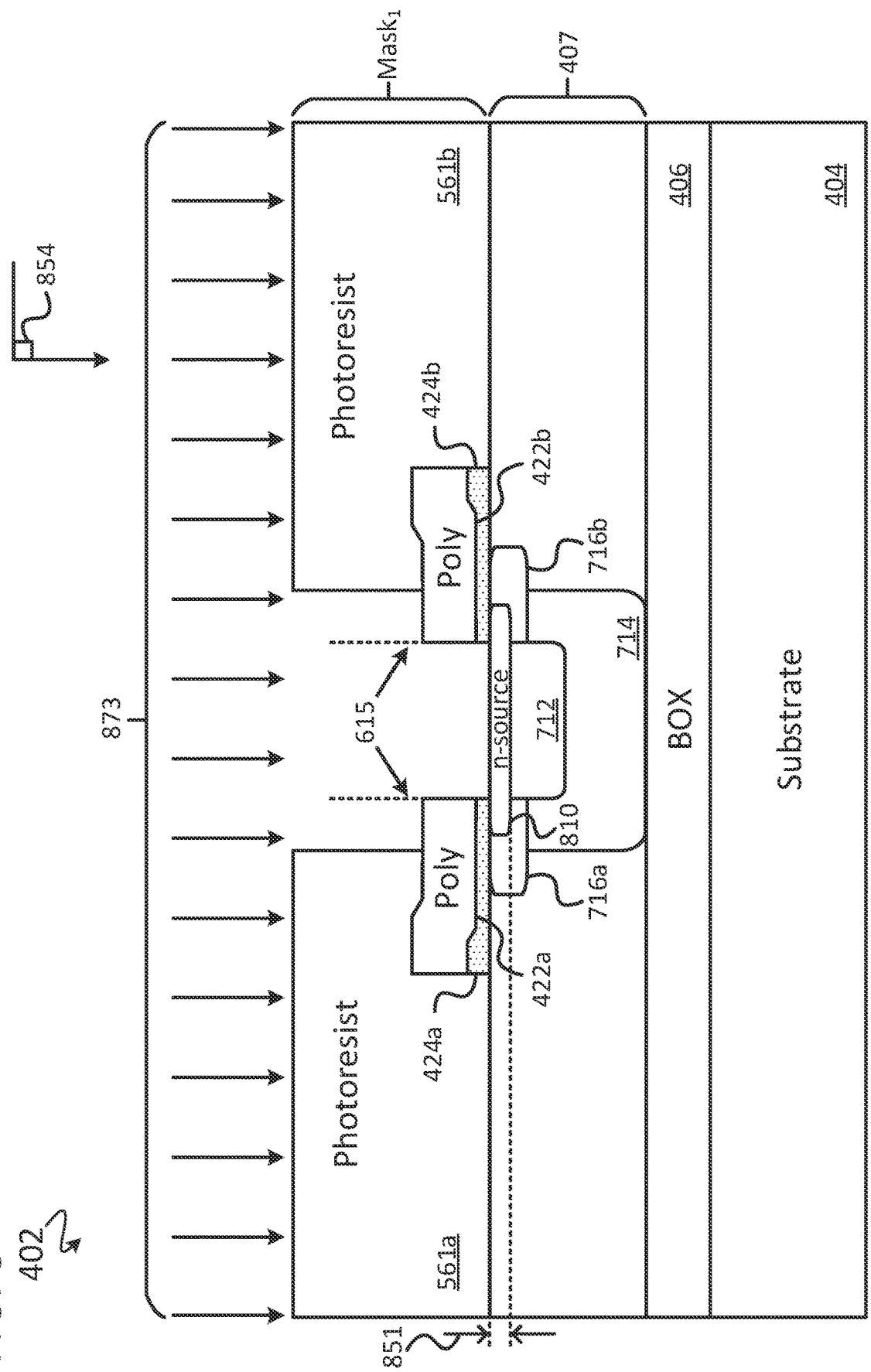

FIG. 8 illustrates the LDMOS device 402 after formation of an n-type source region 810 having a depth 851 by dopants 873 at a tilt angle 854, using the photoresist regions 561a, 561b and the gate polysilicon 422a, 422b as a mask (i.e., Mask$_1$), in accordance with some embodiments. In some embodiments, the photoresist regions 561a-b extend to an outer edge of the LDMOS device 402. In some embodiments, the tilt angle 854 ranges from 70 degrees to 120 degrees from a horizontal plane that is parallel to a top surface of the active layer 407. Implant conditions of the source region 810 are such that the dopants 873 do not penetrate through a thickness of the gate polysilicon 422a, 422b. The source region 810 is of a higher implant concentration and is of a shallower depth as compared to that of conventional LDMOS devices. In some embodiments, the dopants 873 are n-type dopants and include Arsenic and are implanted at a relatively high concentration ranging from 1e14 As/cm$^2$ to 2.5e15 As/cm$^2$. To achieve a shallow depth, the source region 810 is implanted using low energy implants, for example, having a range of 7 to 20 keV for an Arsenic source. In some embodiments, the dopants 873 include first and second Arsenic implants. The first Arsenic implant is a low energy, high concentration, Arsenic implant to form the n-type source region 810 close to the top surface of the active layer 407, as shown by an indication in FIG. 8 of a depth 851 of the n-type source region 810. In some embodiments, the depth 851 of the source region 810 ranges from 80 nm to 200 nm. In some embodiments, a second Arsenic implant of the dopants 873 is conducted at a slightly higher energy and at a similar concentration as compared to the first Arsenic implant of the dopants 873. In such embodiments, the energy of the second Arsenic implants of the dopants 873 ranges from 20 keV to 70 keV. The source region 810 is aligned to the gate polysilicon 422a-b.

After formation of the source region 810, the photoresist regions 561a-b of Mask$_1$ are removed.

In conventional processes for forming LDMOS devices, source region doping is conventionally performed at a standard N+ photo/implant step. LDMOS devices formed using conventional processes thus have a deeper n-type junction than that of the LDMOS device 402 as disclosed herein. As a result, a deep p-well implant of a conventional LDMOS device may therefore have to be deeper as compared to the LDMOS device 402 and thus may not be self-aligned to a gate polysilicon opening of that device's active layer. In comparison, FIGS. 5-8 illustrate the use of a single mask (Mask$_1$), that includes photoresist (561a-b) and utilizes the gate polysilicon 422a-b, for advantageously forming four regions (616, 712, 714, 810) of the LDMOS device 402 that are self-aligned, as well as aligned to the gate polysilicon 422a-b. Additionally, using a conventional n-type photo/implant step to dope both sides of a source region adjacent to gate polysilicon of a conventional LDMOS device may leave a long thin line of resist centered between the gate polysilicon of that device to allow for a p-type source connection region implant, which may cause processing issues with resist lifting. The process 1500 disclosed herein circumvents this issue by using a source region dopant concentration that is lower than a p-type dopant concentration of a source connection region, thereby allowing the p-type dopant to counter dope the source region.

Figure 9:
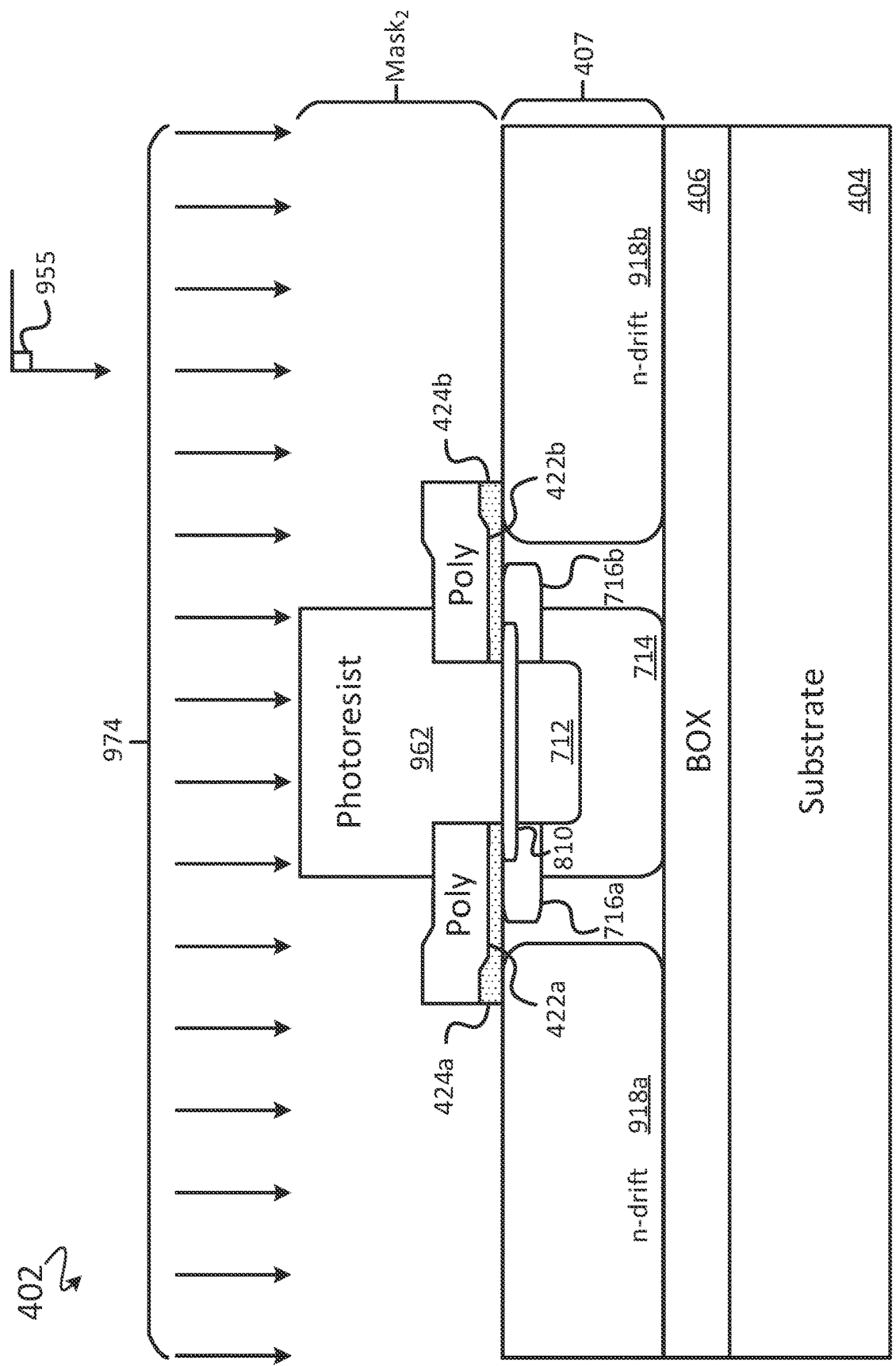

FIG. 9 illustrates the LDMOS device 402 after a second mask Mask$_2$ that includes a photoresist region 962 is formed on the active layer 407 and after drift regions 918a, 918b (i.e., LDD regions) are formed in the active layer 407 by dopants 974 at a tilt angle 955 using the photoresist region 962 as a drift region mask, in accordance with some embodiments. An implant module used to form the n-type drift regions 918a-b includes one to several implant steps to tailor a doping profile of the drift regions 918a-b. Individual doses of the dopants 974 are implanted at a concentration ranging from 5e11 P/cm$^2$ to 7e12 P/cm$^2$. In some embodiments, the tilt angle 955 is perpendicular to a horizontal plane that is parallel to a top surface of the active layer 407, in other embodiments, the tilt angle 955 ranges from 70 degrees to 120 degrees from the horizontal plane that is parallel to the top surface of the active layer 407. After formation of the drift regions 918a-b, the photoresist region 962 of Mask$_2$ is removed.

Figure 10:
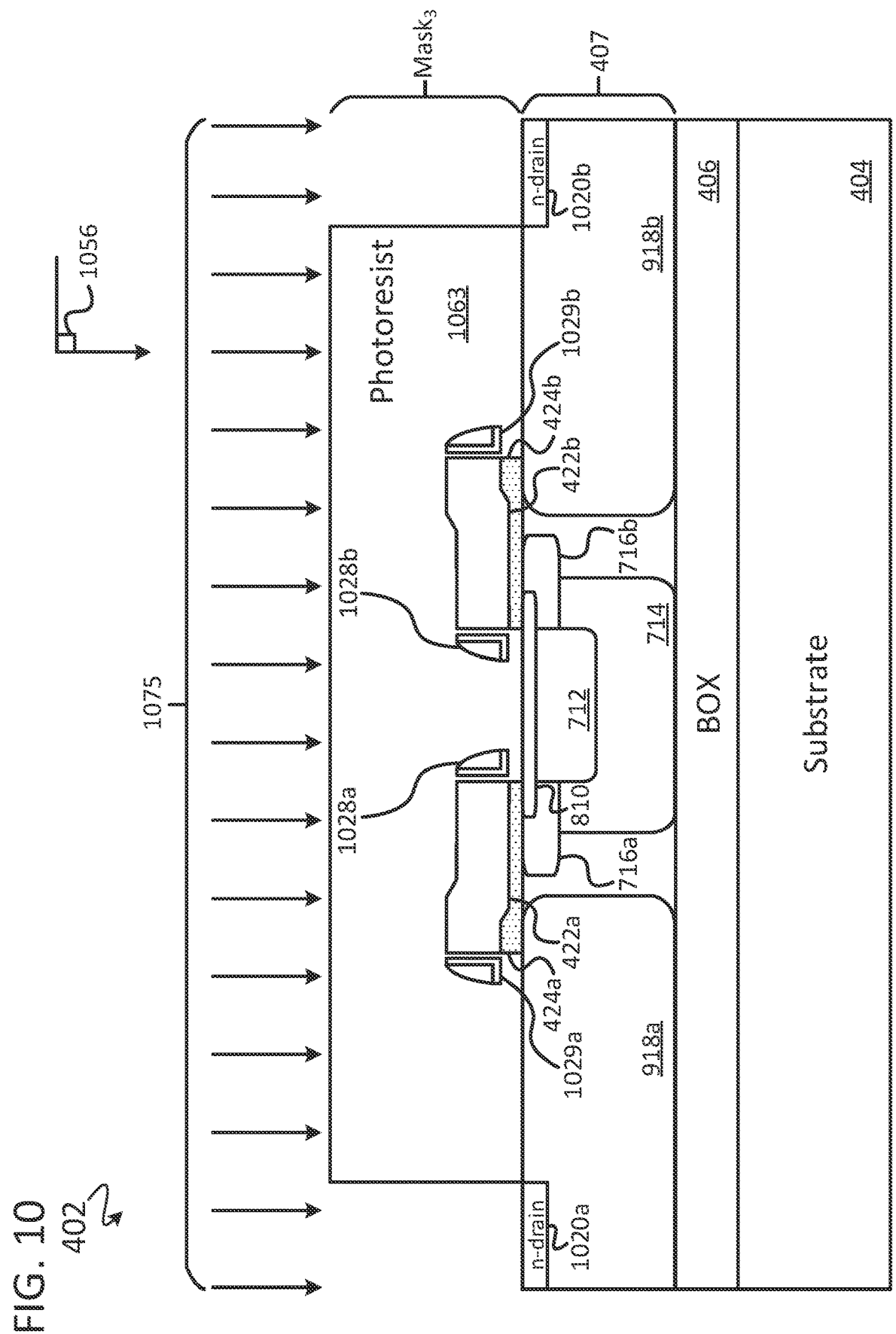

FIG. 10 illustrates the LDMOS device 402 after a third mask Mask$_3$ that includes a photoresist region 1063 has been formed on the active layer 407 and after n-drain regions 1020a, 1020b are formed in the active layer 407 by dopants 1075 at a tilt angle 1056 using the photoresist region 1063 as a drain region mask, in accordance with some embodiments. Also shown are polysilicon gate spacers 1028a, 1028b and 1029a, 1029b formed on respective inner and outer sides the of the gate polysilicon 422a, 422b. The polysilicon gate spacer 1029a is vertically disposed above the drift region 918a, and the polysilicon gate spacer 1028a is vertically disposed above the source region 810. Similarly, the polysilicon gate spacer 1029b is vertically disposed above the drift region 918b, and the polysilicon gate spacer 1028b is vertically disposed above the source region 810. In some embodiments, respective lateral extents of the gate spacers 1028a-b and 1029a-b are selected in accordance with a desired lateral extent of a source connection region of the LDMOS device 402. In some embodiments, the dopants 1075 are n-type dopants that include Arsenic and Phosphorus and are implanted at high concentrations, e.g., 3e15 As/cm$^2$ and 8e13 P/cm$^2$, to form a low resistance ohmic contact to respective metal drain contacts. After formation of the drain regions 1020a-b, the photoresist region 1063 of Mask$_3$ is removed.

Figure 11A:
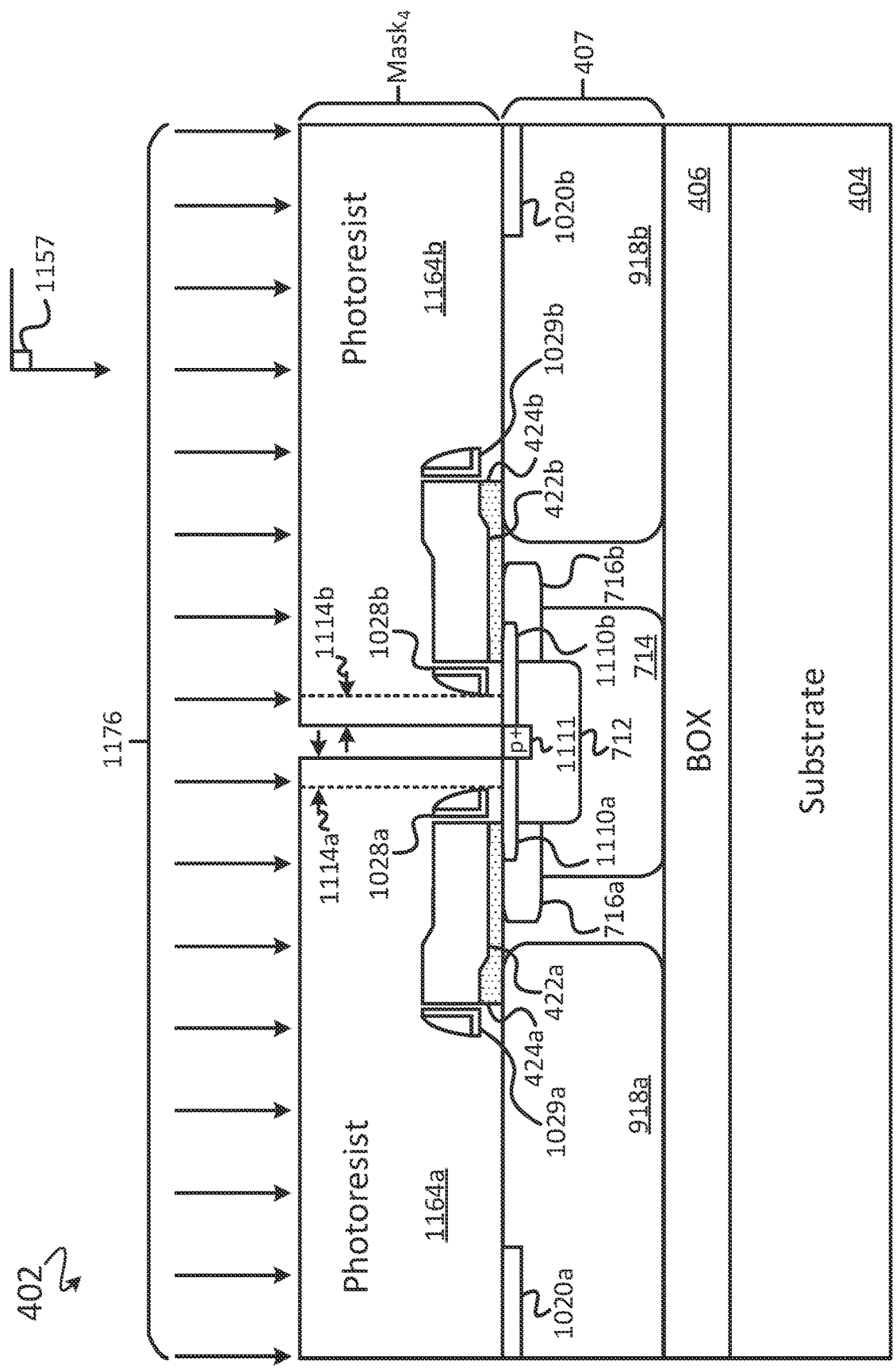
Figure 11B:
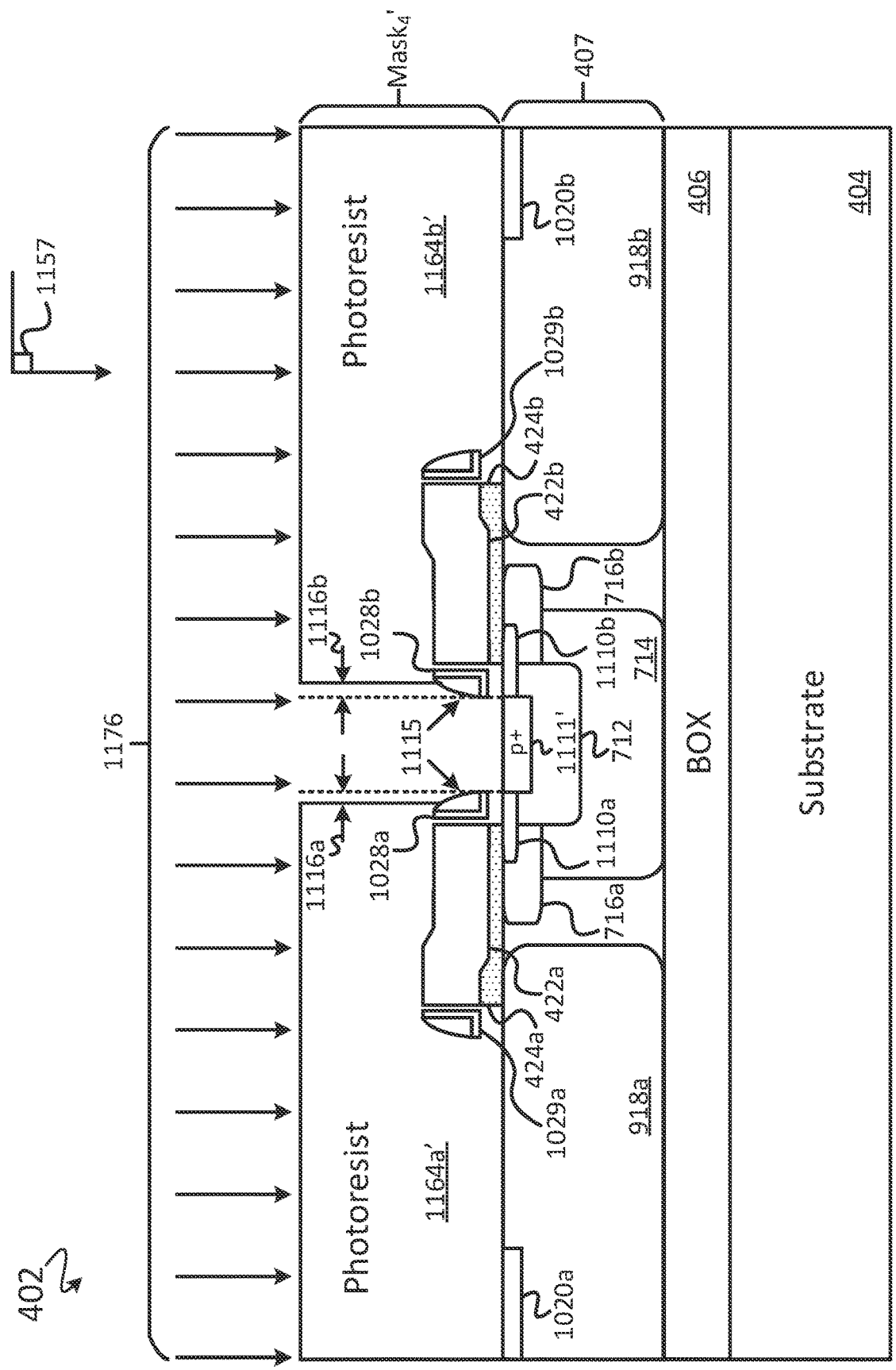

FIG. 11A illustrates a first example of the LDMOS device 402 after a fourth mask Mask$_4$ that includes photoresist regions 1164a, 1164b has been formed on the active layer 407 and a heavily doped p-type source connection region 1111 has been formed in the active layer 407 by dopants 1176 implanted at a tilt angle 1157 using the photoresist regions 1164a, 1164b as a mask, in accordance with some embodiments. In some embodiments, the photoresist regions 1164a-b extend to an outer edge of the LDMOS device 402. The photoresist region 1164a extends past an inner edge of the polysilicon gate spacer 1028a, onto the active layer 407, for a lateral extent 1114a. Similarly, the photoresist region 1164b extends past an inner edge of the polysilicon gate spacer 1028b, onto the active layer 407, for a lateral extent 1114b. Thus, the photoresist region 1164a extends for, or beyond, an entire lateral extent of the polysilicon gate spacer 1028a, and the photoresist region 1164b extends for, or beyond, an entire lateral extent of the polysilicon gate spacer 1028b. A region of the active layer 407 between the lateral extent 1114a and the lateral extent 1114b is exposed to the dopants 1176 that are implanted at the tilt angle 1157 to form the source connection region 1111. As shown, the source region 810 of FIG. 8 has been segmented by the source connection region 1111 into n-type source regions 1110a, 1110b. The source connection region 1111/1111' shown in FIG. 11A and in FIG. 11B is a heavily doped p-type region suitable for forming a good ohmic contact with a metal source contact. In some embodiments, the tilt angle 1157 is perpendicular to a horizontal plane that is parallel to a top surface of the active layer 407, in other embodiments, the tilt angle 1157 ranges from 70 degrees to 120 degrees from the horizontal plane that is parallel to the top surface of the active layer 407. In some embodiments, the dopants 1176 are p-type dopants that include Boron, and are implanted at a high concentration, ranging from 1e15 B/cm$^2$ to 5e15 B/cm$^2$. In some embodiments, the lateral extents 1114a-b have a width of 0 nm to 0.2 μm and the lateral range of the exposed region of the active layer 407 has a width of 0.1 μm to 0.4 μm.

FIG. 11B illustrates an alternative example of the LDMOS device 402 after an alternative fourth mask Mask$_4$' that includes photoresist regions 1164a', 1164b' has been formed on the active layer 407 and a heavily doped p-type connection region 1111' has been formed in the active layer 407 by the dopants 1176 at the tilt angle 1157 using the photoresist regions 1164a', 1164b' and the polysilicon gate spacers 1028a, 1028b as a mask, in accordance with some embodiments. In some embodiments, the photoresist regions 1164a'-b' extend to an outer edge of the LDMOS device 402. As shown, the source region 810 of FIG. 8 has been segmented by the source connection region 1111' into n-type source regions 1110a, 1110b.

The photoresist region 1164a' is excluded from (i.e., is not formed on) a lateral extent 1116a of the polysilicon gate spacer 1028a, and the photoresist region 1164b' is excluded from a lateral extent 1116b of the polysilicon gate spacer 1028b. A region of the active layer 407 between the polysilicon gate spacer 1028a and the polysilicon gate spacer 1028b is exposed to the dopants 1176 that are implanted at the tilt angle 1157 to form the source connection region 1111'. The lateral extents 1116a-b of the polysilicon gate spacers 1028a-b are operable to mask the active layer 407 from the dopants 1176, and thus the source connection region 1111' formed by the dopants 1176 is advantageously aligned with an inner edge 1115 of the polysilicon gate spacers 1028a-b. In some embodiments, the lateral extents 1116a-b have a width of 30 nm to 100 nm and the lateral range of the exposed region of the active layer 407 has a width of 0.2 μm to 0.6 μm.

In comparison, photoresist regions in conventional LDMOS formation processes are typically drawn between the gate polysilicon of a conventional LDMOS device with enough margin to leave room for a source implant and polysilicon gate spacers. However, in the embodiment shown, the photoresist regions 1164a', 1164b' are drawn close to, or overlapping the polysilicon gate spacers 1028a, 1028b, thereby forming the source connection region 1111' such that the source connection region 1111' is self-aligned to the polysilicon gate spacers 1028a, 1028b. Thus, the polysilicon gate spacers 1028a, 1028b shield the source regions 1110a, 1110b from the dopants 1176. As a result, advantageously smaller source regions 1110a-b of the LDMOS device 402 are created as compared to that of a conventional LDMOS device.

Figure 12:
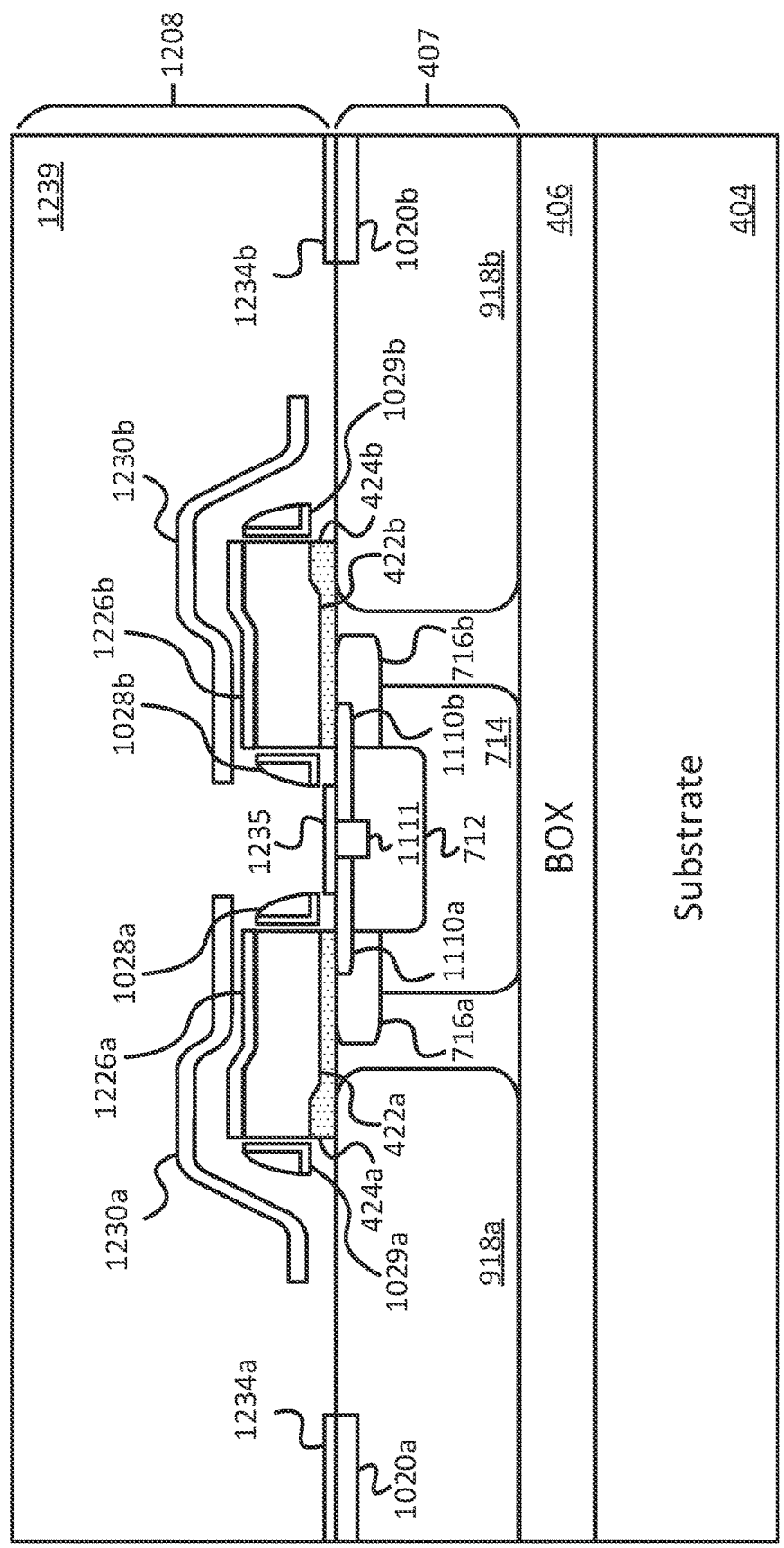

FIG. 12 illustrates the LDMOS device 402 after formation of some elements of a gate and contact layer 1208 on the active layer 407, in accordance with some embodiments. The elements of the gate and contact layer 1208 shown in FIG. 12 include a first portion of a first metal drain contact 1234a, a first gate shield 1230a, a first gate contact 1226a, a metal source contact 1235, a first portion of a second metal drain contact 1234b, a second gate shield 1230b, a second gate contact 1226b, and dielectric 1239. As shown, the first gate contact 1226a is formed on the first gate polysilicon 422a. A first portion of the gate shield 1230a is formed above the first gate contact 1226a. A second portion of the gate shield 1230a extends laterally beyond the polysilicon gate spacer 1029a and is vertically disposed above the drift region 918a. The second portion of the gate shield 1230a is closer to a top surface of the active layer 407 than the first portion of the gate shield 1230a. Similarly, the second gate contact 1226b is formed on the second gate polysilicon 422b. A first portion of the gate shield 1230b is formed above the second gate contact 1226b. A second portion of the gate shield 1230b extends laterally beyond the polysilicon gate spacer 1029b and is vertically disposed above the drift region 918b. The second portion of the gate shield 1230b is closer to the top surface of the active layer 407 than the first portion of the gate shield 1230b. At the stage of formation of the LDMOS device 402 shown in FIG. 12, the dielectric 1239 covers all of the components in the gate and contact layer 1208. The gate shields 1230a-b advantageously reduce a capacitive coupling of the gate polysilicon 422a-b to metallization of the respective drain regions 1020a-b.

Figure 13:
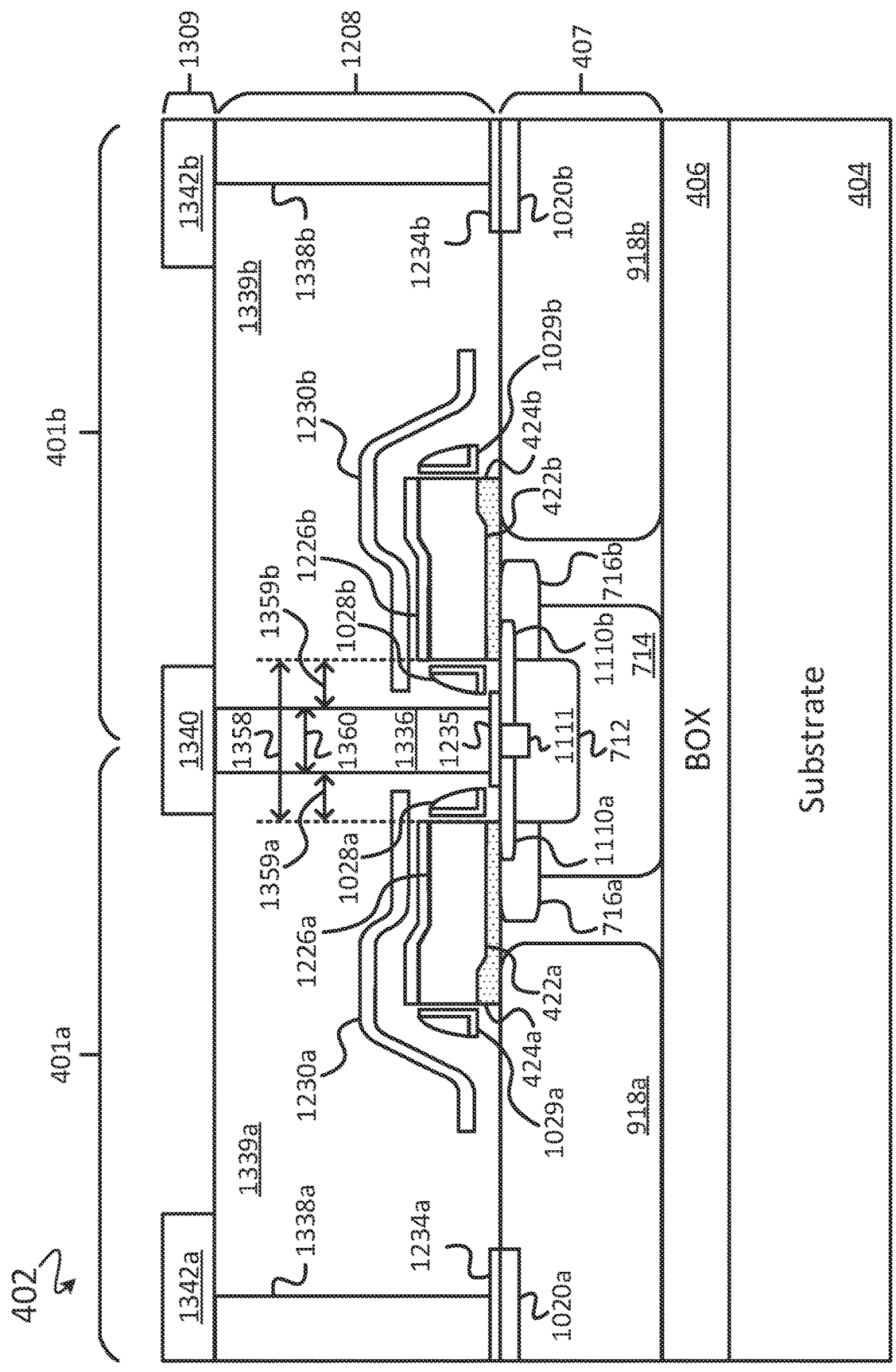

FIG. 13 illustrates a first example of the LDMOS device 402 after formation of additional elements of the gate and contact layer 1208 on the active layer 407 and a metallization layer 1309, in accordance with some embodiments. The elements of the gate and contact layer 1208 shown in FIG. 13 include a second portion of the first metal drain contact 1338a, a second portion of the second metal drain contact 1338b, a first portion of dielectric 1339a, and a second portion of dielectric 1339b (of the dielectric 1239, shown in FIG. 12). The metallization layer 1309 includes a third portion of the first metal drain contact 1342a, a third portion of the metal source contact 1340 (i.e., top metal), and a third portion of the second metal drain contact 1342b (i.e., top metal). Also shown are dimensional indicators of lateral extents 1358, 1359a, 1359b, and 1360.

In some embodiments, layout dimensions for a source region of the LDMOS device 402 are determined by a lateral extent 1358 between the gate polysilicon 422a, 422b, a width 1360 of the second portion of the metal source contact 1336, the lateral extent 1359a between the gate polysilicon 422a and the second portion of the metal source contact 1336, and the lateral extent 1359b between the gate polysilicon 422b and the second portion of the metal source contact 1336 and depend on the technology node of the LDMOS device 402. As a first example, for a 0.18 µm technology node, the lateral extent 1358 (i.e., a source width) between the gate polysilicon 422a, 422b may be equal to 0.25 µm, the width 1360 of the second portion of the metal source contact 1336 may be equal to 0.22 µm, and the lateral extents 1359a, 1359b between the gate polysilicon 422a, 422b and the second portion of the metal source contact 1336, respectively, may each be equal to 0.16 µm. As a second example, for a 90 nm technology node, the lateral extent 1358 between the gate polysilicon 422a, 422b may be equal to 0.17 µm, the width 1360 of the second portion of the metal source contact 1336 may be equal to 0.12 µm, and the lateral extents 1359a, 1359b between the gate polysilicon 422a, 422b and the second portion of the metal source contact 1336, respectively, may be equal to 0.10 µm. In some embodiments, the limiting rules for a minimum source width (i.e., the lateral extent 1358) of the LDMOS device 402 is equal to the width 1360 plus the lateral extent 1359a, plus the lateral extent 1359b. Thus, using the example dimensions given previously in this paragraph, for a 0.18 µm node, the source width of the LDMOS device 402 is 0.54 µm, and for a 90 nm technology node, the source width of the LDMOS device 402 is 0.32 µm.

Figure 14:
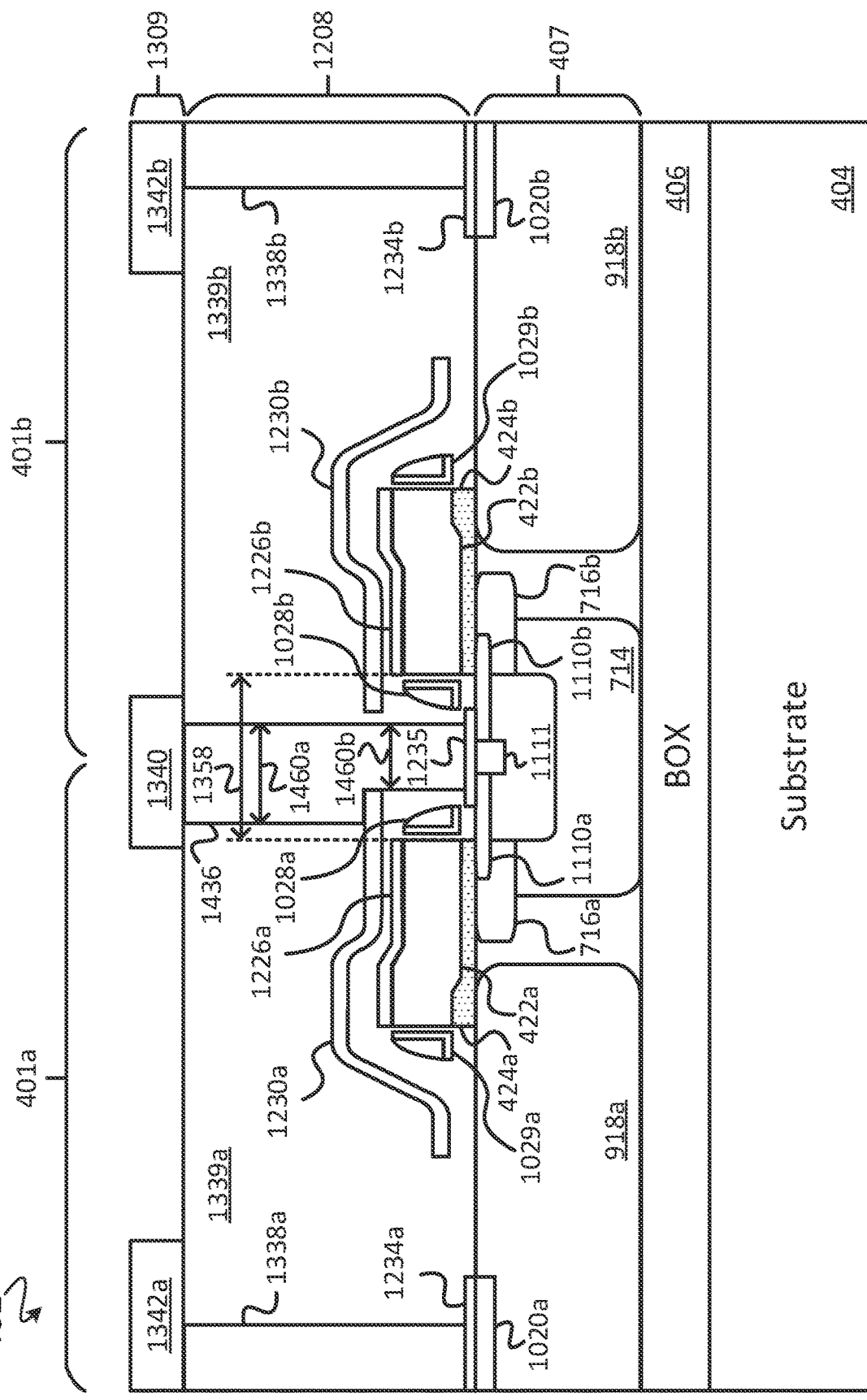

FIG. 14 illustrates a second example of the LDMOS device 402 after formation of additional elements of the gate and contact layer 1208 on the active layer 407 and a metallization layer 1309, in accordance with some embodiments. The elements of the gate and contact layer 1208 shown in FIG. 14 include a second example of a second portion of the metal source contact 1436. In the example embodiment shown, the gate shield 1230a is used as a metal source contact etch stop for the second portion of the metal source contact 1436 such that a width of the second portion of the metal source contact 1436 along a first vertical extent overlaps a portion of the gate shield 1430a. The second portion of the metal source contact 1436 has a first width 1460a along the first vertical extent above a top surface of the first gate shield 1230a, and a second, narrower, width 1460b along a second vertical extent below the top surface of the first gate shield 1230a and between the gate polysilicon 422a-b. In the example shown, the first width 1460a is wider is than the second width 1460b. By advantageously providing a wider area for the formation of the third portion of the metal source contact 1340, the overlapped gate shield section allows a source contact at the p-type source connection region 1111 to be narrower. That is, the width 1460b is narrower than a minimum contact feature size of the LDMOS device 402. As a result, the cell pitch of the LDMOS device 402 can be reduced as compared to a conventional LDMOS device.

Figure 15:
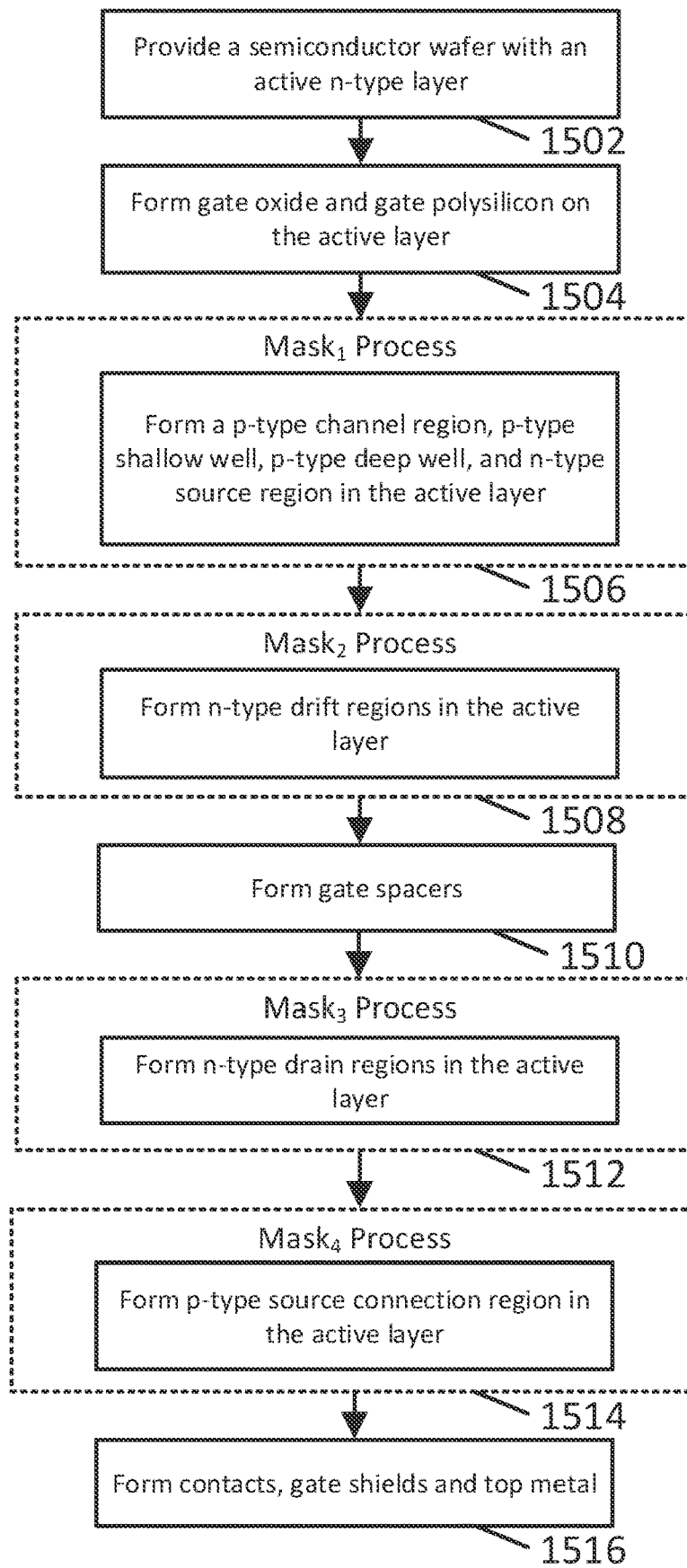
FIGS. 15-19B show simplified steps of a portion of an example process for forming the LDMOS device shown in FIG. 3, in accordance with some embodiments.

Details for forming the LDMOS device 302/402 are described at a high level by an example process 1500 illustrated in FIG. 15, in accordance with some embodiments. The particular steps, order of steps, and combination of steps are shown in FIG. 15 for illustrative and explanatory purposes only. Other embodiments can implement different particular steps, orders of steps, and combinations of steps to achieve similar functions or results. The steps of FIG. 15 are described with reference to FIGS. 4-14.

At step 1502, a semiconductor wafer (e.g., the substrate 404 and the BOX layer 406) with an active n-type layer 407 is provided. At step 1504, gate oxide 424a-b and gate polysilicon 422a-b are formed on the active layer 407. At step 1506, the p-type channel region 616, the p-type shallow well 712, the p-type deep well 714, and the n-type source region 810 are each formed in the active layer 407 as part of a process designated as $Mask_1$. At step 1508, the n-type drift regions 918a, 918b are formed in the active layer 407 as part of a process designated as $Mask_2$. At step 1510, the polysilicon gate spacers 1028a-b, 1029a-b are formed adjacent to the gate polysilicon 422a-b. At step 1512, the n-type drain regions 1020a-b are formed in the active layer 407 as part of a process designated as $Mask_3$. At step 1514, the p-type source connection region 1111 is formed in the active layer 407 as part of a process designated as $Mask_4$ (or the p-type source connection region 1111' is formed using $Mask_4'$). At step 1516, the gate shields 1230*a-b*, gate contacts 1226*a-b*, metal drain contacts 1234*a-b*, 1338*a-b*, metal source contact 1235, 1336, and top metal 1340, 1342*a-b* are formed, and the dielectric 1339*a-b* is formed.

Figure 16:
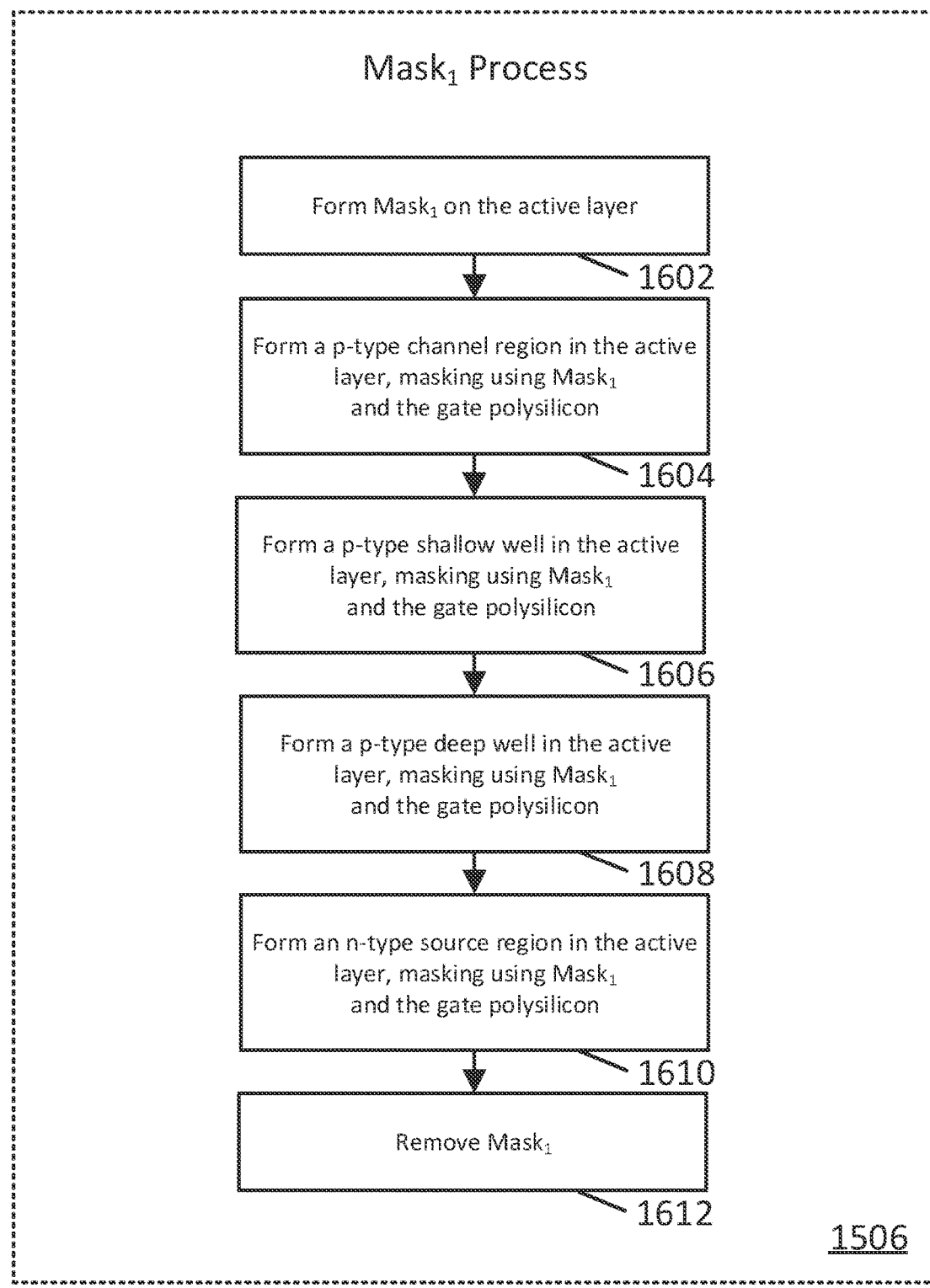

Details of an example embodiment of step 1506 ("Mask$_1$ Process") are shown in FIG. 16, in accordance with some embodiments. The particular steps, order of steps, and combination of steps are shown in FIG. 16 for illustrative and explanatory purposes only. Other embodiments can implement different particular steps, orders of steps, and combinations of steps to achieve similar functions or results. The steps of FIG. 16 are described with reference to FIGS. 5-8.

At step 1602, the masking region Mask$_1$ is formed on the active layer 407. The masking region Mask$_1$ includes the photoresist regions 561*a*, 561*b*, and the gate polysilicon 422*a-b* which is advantageously operable to perform masking functions. At step 1604, the p-type channel region 616 is formed in the active layer 407 by the dopants 671 using the photoresist regions 561*a*, 561*b* and the gate polysilicon 422*a-b* as a mask, as shown in FIG. 6. The dopants 671 are implanted and thermally driven at the first range of tilt angles 652*a* to form a first portion of the p-type channel region 616 that extends horizontally for a lateral extent 614*a* under the gate polysilicon 422*a*. Similarly, the dopants 671 are implanted and thermally driven at the second range of tilt angles 652*b* to form a second portion of the p-type channel region 616 that extends horizontally for a lateral extent 614*b* under the gate polysilicon 422*b*. A third portion of the p-type channel region 616 that extends laterally between the inner edge 615 of the gate polysilicon 422*a* and the gate polysilicon 422*b* is formed by either of, or a combination thereof, implantation at the tilt angles 652*a-b*.

At step 1606, the p-type shallow well 712 is formed in the active layer 407 by the dopants 772 using the photoresist regions 561*a-b* and the gate polysilicon 422*a-b* as a mask, as shown in FIG. 7. The dopants 772 are implanted at tilt angle 753 such that the p-type shallow well 712 is aligned with the inner edge 615 of the gate polysilicon 422*a-b*.

At step 1608, the p-type deep well 714 is formed in the active layer 407 by the dopants 772 using the photoresist regions 561*a-b* and the gate polysilicon 422*a-b* as a mask for a heavy p-type doping. The dopants 772 are implanted at the tilt angle 753 such that the deep well 714 is aligned with the inner edges 615 of the gate polysilicon 422*a-b*, though the dopants 772 may spread.

At step 1610, the n-type source region 810 is formed in the active layer 407 by the dopants 873 implanted at the tilt angle 854 using the photoresist regions 561*a*, 561*b* and the gate polysilicon 422*a*, 422*b* as a mask, as shown in FIG. 8. At step 1612, the photoresist regions 561*a*, 561*b* of the Mask$_1$ region are removed.

Figure 17:
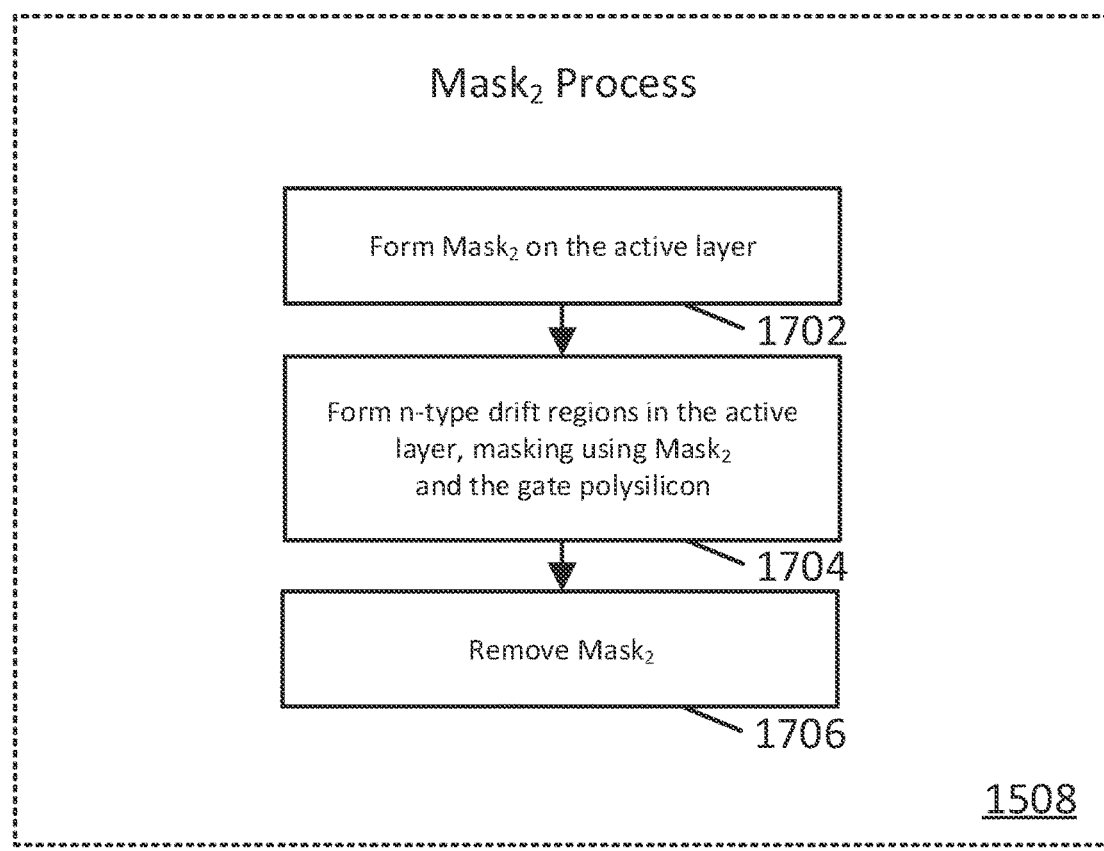

Details of an example embodiment of step 1508 ("Mask$_2$ Process") are shown in FIG. 17, in accordance with some embodiments. The particular steps, order of steps, and combination of steps are shown in FIG. 17 for illustrative and explanatory purposes only. Other embodiments can implement different particular steps, orders of steps, and combinations of steps to achieve similar functions or results. The steps of FIG. 17 are described with reference to FIG. 9.

At step 1702, the masking region Mask$_2$ is formed on the active layer 407. In some embodiments, the masking region Mask$_2$ includes the photoresist region 962, and the gate polysilicon 422*a-b* is advantageously operable to perform masking functions. At step 1704, the n-type drift regions 918*a-b* are formed in the active layer 407 by the dopants 974 implanted at the tilt angle 955 using the photoresist region 962 and the gate polysilicon 422*a-b* as a mask, as shown in FIG. 9. At step 1706, the photoresist region 962 of the Mask$_2$ region is removed.

Figure 18:
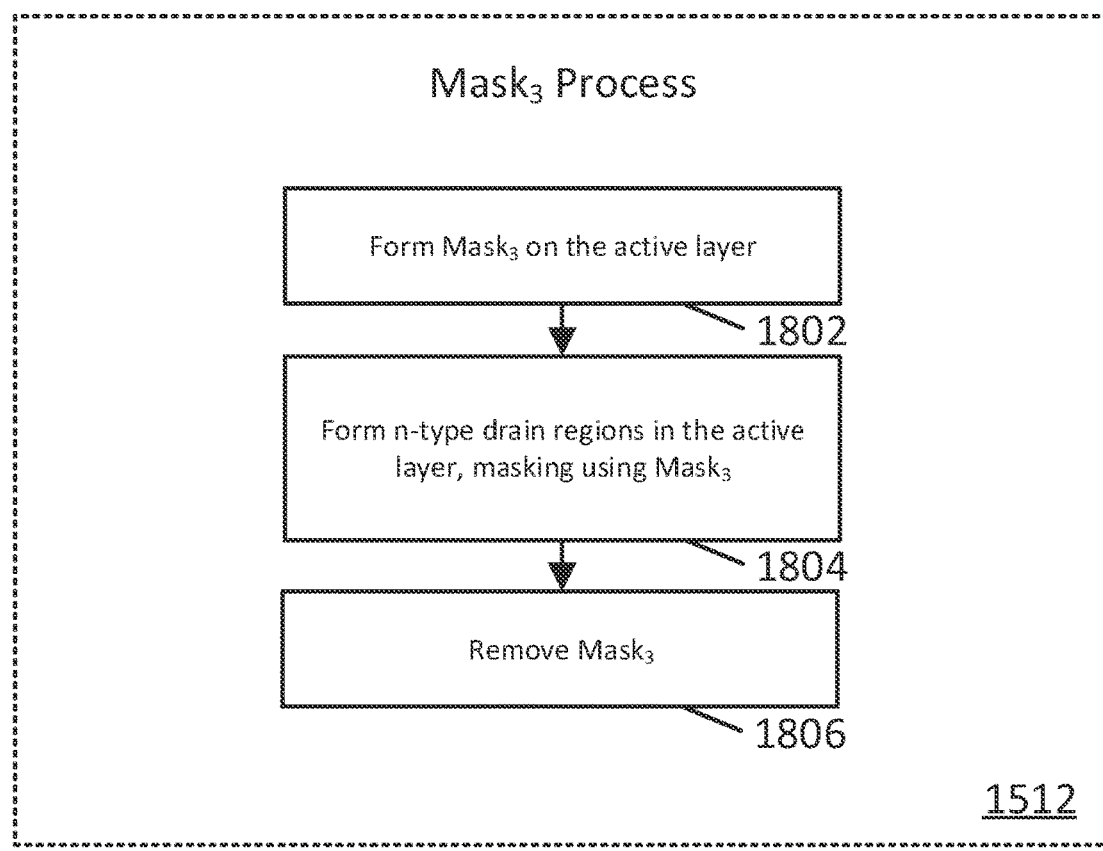

Details of an example embodiment of step 1512 ("Mask$_3$ Process") are shown in FIG. 18, in accordance with some embodiments. The particular steps, order of steps, and combination of steps are shown in FIG. 18 for illustrative and explanatory purposes only. Other embodiments can implement different particular steps, orders of steps, and combinations of steps to achieve similar functions or results. The steps of FIG. 18 are described with reference to FIG. 10.

At step 1802, the masking region Mask$_3$ is formed on the active layer 407. In some embodiments, the masking region Mask$_3$ includes the photoresist region 1063. At step 1804, the n-type drain regions 1020*a*, 1020*b* are formed in the active layer 407 by the dopants 1075 implanted at the tilt angle 1056 using the photoresist region 1063 as a mask, as shown in FIG. 10. The dopants 1075 are deposited at the tilt angle 1056 such that the n-drain regions 1020*a-b* are aligned with outer edges of the photoresist region 1063. In some embodiments, the tilt angle 1056 ranges from 70 degrees to 120 degrees from a top surface of the horizontal plane that is parallel to the active layer 407. At step 1806, the photoresist region 1063 of the Mask$_3$ region is removed.

Figure 19A:
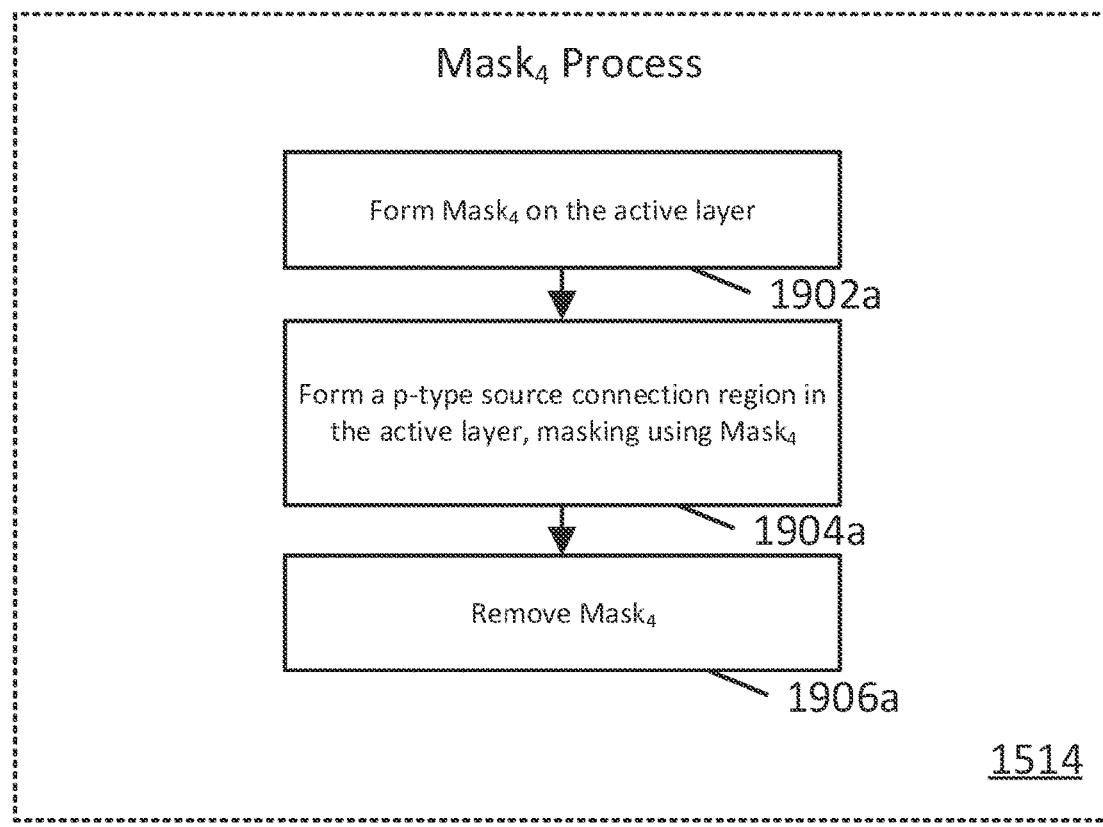

Details of a first example embodiment of step 1514 ("Mask$_4$ Process") is shown in FIG. 19A, in accordance with some embodiments. The particular steps, order of steps, and combination of steps are shown in FIG. 19A for illustrative and explanatory purposes only. Other embodiments can implement different particular steps, orders of steps, and combinations of steps to achieve similar functions or results. The steps of FIG. 19A are described with reference to FIG. 11A. At step 1902*a*, the masking region Mask$_4$ is formed on the active layer 407. In some embodiments, the masking region Mask$_4$ includes the photoresist regions 1164*a*, 1164*b*. At step 1904*a*, the p-type (i.e., P+) source connection region 1111 is formed in the active layer 407 by the dopants 1176 using the photoresist regions 1164*a-b* as a mask, as shown in FIG. 11A. The dopants 1176 are implanted at the tilt angle 1157 such that the p-type source connection region 1111 is aligned with inner edges of the photoresist regions 1164*a-b*. At step 1906*a*, the photoresist regions 1164*a*, 1164*b* of the Mask$_4$ region are removed.

Figure 19B:
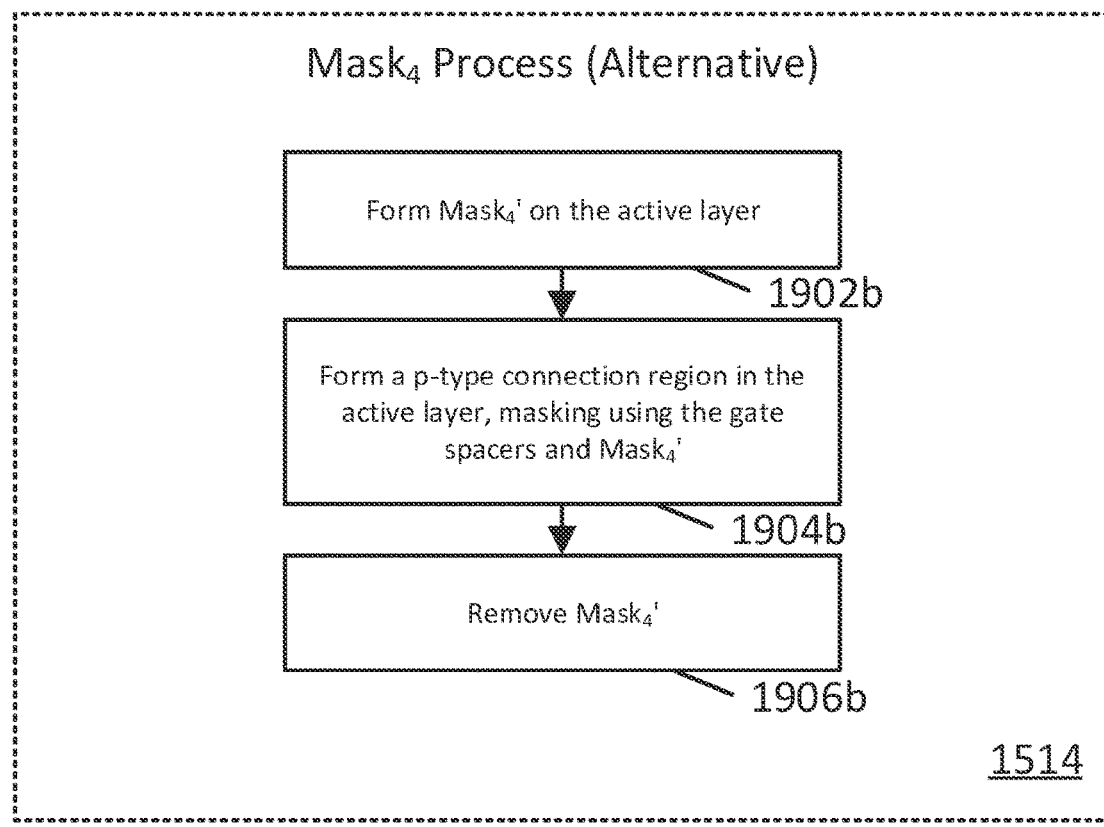

Details of a second example embodiment of step 1514 ("Mask$_4$ Process") is shown in FIG. 19B, in accordance with some embodiments. The particular steps, order of steps, and combination of steps are shown in FIG. 19B for illustrative and explanatory purposes only. Other embodiments can implement different particular steps, orders of steps, and combinations of steps to achieve similar functions or results. The steps of FIG. 19B are described with reference to FIG. 11B.

At step 1902*b*, the masking region Mask$_4$' is formed on the active layer 407. In some embodiments, the masking region Mask$_4$' includes the photoresist regions 1164*a*'-*b*'. At step 1904*b*, the p-type (i.e., P+) source connection region 1111' is formed in the active layer 407 by the dopants 1176 using the photoresist regions 1164*a*'-b' and the polysilicon gate spacers 1028*a-b* as a mask, as shown in FIG. 11B. The dopants 1176 are deposited at the tilt angle 1157 such that the p-type source connection region 1111 is aligned with the inner edges 1115 of the polysilicon gate spacers 1028*a-b*. At step 1906*b*, the photoresist regions 1164*a*', 1164*b*' of the Mask$_4$' region are removed.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

The terms "lateral" and "horizontal" refer to a direction or a plane parallel to the plane or surface of a substrate without regard to orientation. The term "vertical" refers to a direction perpendicular to the horizontal. Terms, such as "on", "above", "bottom", "top", "side", "upper", and "over", are defined with respect to the horizontal plane.

What is claimed is:

1. A method for forming a semiconductor device, comprising:
   providing a semiconductor wafer having a substrate layer, and an active layer of a first conductivity type;
   forming a first gate on the active layer, the first gate comprising first gate polysilicon;
   forming a second gate on the active layer, the second gate being laterally disposed from the first gate and comprising second gate polysilicon;
   forming a first mask region on the active layer;
   forming in the active layer between the first gate and the second gate using the first mask region, the first gate polysilicon, and the second gate polysilicon as a mask, a deep well of a second conductivity type, a shallow well of the second conductivity type, a source region of the first conductivity type, and a channel region segmented into a first channel region of the second conductivity type, and a second channel region of the second conductivity type; and
   forming in the active layer using one or more second mask regions, a first drift region of the first conductivity type, a second drift region of the first conductivity type, a first drain region of the first conductivity type, a second drain region of the first conductivity type, and a source connection region of the second conductivity type.

2. The method of claim 1, wherein:
   the first conductivity type is an n-type conductivity; and
   the second conductivity type is a p-type conductivity.

3. The method of claim 1, wherein the first mask region comprises:
   a first region of photoresist formed on the active layer and formed on a first lateral extent of the first gate polysilicon, the first region of photoresist excluding a second lateral extent of the first gate polysilicon and a lateral extent of the active layer, the first lateral extent of the active layer being disposed between the first gate polysilicon and the second gate polysilicon; and
   a second region of photoresist formed on the active layer and formed on a first lateral extent of the second gate polysilicon, the second region of photoresist excluding a second lateral extent of the second gate polysilicon and the lateral extent of the active layer.

4. The method of claim 3, wherein:
   the first region of photoresist, the second region of photoresist, the second lateral extent of the first gate polysilicon, and the second lateral extent of the second gate polysilicon shield the active layer from dopants implanted at an implantation angle that is perpendicular to a horizontal plane of the active layer, the horizontal plane being parallel to a top surface of the active layer.

5. The method of claim 4, wherein:
   forming the first channel region comprises implanting and thermally driving dopants of the second conductivity type at a first range of implantation angles such that the dopants of the second conductivity type extend under the first gate polysilicon for a first lateral extent, the first and second regions of photoresist and the second lateral extents of the first and second gate polysilicon being used as a mask; and
   forming the second channel region comprises implanting and thermally driving the dopants of the second conductivity type at a second range of implantation angles such that the dopants of the second conductivity type extend under the second gate polysilicon for a second lateral extent, the first and second regions of photoresist and the second lateral extents of the first and second gate polysilicon being used as a mask.

6. The method of claim 4, wherein forming the shallow well comprises:
   implanting dopants of the second conductivity type at an implantation angle such that the shallow well has a lateral extent that is laterally aligned with an inner edge of the first gate polysilicon and an inner edge of the second gate polysilicon, the first and second regions of photoresist and the second lateral extents of the first and second gate polysilicon being used as a mask.

7. The method of claim 4, wherein forming the deep well comprises:
   implanting dopants of the second conductivity type at an implantation angle such that the deep well is formed directly below the source region, the first and second regions of photoresist and the second lateral extents of the first and second gate polysilicon being used as a mask.

8. The method of claim 4, wherein forming the source region comprises:
   implanting dopants of the first conductivity type at an implantation angle such that the source region is laterally aligned with an inner edge of the first gate polysilicon and an inner edge of the second gate polysilicon, the first and second regions of photoresist and the second lateral extents of the first and second gate polysilicon being used as a mask.

9. The method of claim 1, wherein forming the first drift region and the second drift region comprises:
   forming a drift region mask on the active layer; and
   implanting dopants of the first conductivity type at an implantation angle such that the first drift region and the second drift region are each laterally aligned with a respective edge of the drift region mask.

10. The method of claim 1, wherein forming the first drain region and the second drain region comprises:
    forming a drain region mask on the active layer; and
    implanting dopants of the first conductivity type at an implantation angle such that the first drain region and the second drain region are each laterally aligned with a respective edge of the drain region mask.

11. The method of claim 1, wherein before the forming of the source connection region, the method further comprises:
forming a first polysilicon gate spacer on the active layer and laterally disposed next to an inner edge of the first gate polysilicon and vertically disposed above the source region; and
forming a second polysilicon gate spacer on the active layer and laterally disposed next to an inner edge of the second gate polysilicon and vertically disposed above the source region.

12. The method of claim 11, wherein forming the source connection region comprises:
forming a first region of photoresist on the active layer, on the first gate polysilicon, and on a first lateral extent of the first polysilicon gate spacer, the first region of photoresist excluding a first lateral extent of the active layer disposed between the first polysilicon gate spacer and the second polysilicon gate spacer;
forming a second region of photoresist on the active layer, on the second gate polysilicon, and on a first lateral extent of the second polysilicon gate spacer, the second region of photoresist excluding the first lateral extent of the active layer disposed between the first polysilicon gate spacer and the second polysilicon gate spacer; and
implanting dopants of the second conductivity type in the first lateral extent of the active layer disposed between the first polysilicon gate spacer and the second polysilicon gate spacer.

13. The method of claim 12, wherein:
the first lateral extent of the first polysilicon gate spacer is an entire lateral extent of the first polysilicon gate spacer, and the first region of photoresist is formed on the active layer and extends beyond the first polysilicon gate spacer for a second lateral extent of the active layer;
the first lateral extent of the second polysilicon gate spacer is an entire lateral extent of the second polysilicon gate spacer and the second region of photoresist is formed on the active layer and extends beyond the second polysilicon gate spacer for a third lateral extent of the active layer; and
the first lateral extent of the active layer is disposed between the second lateral extent of the active layer and the third lateral extent of the active layer.

14. The method of claim 12, wherein:
the first region of photoresist is formed on a first lateral extent of the first polysilicon gate spacer and excludes a second lateral extent of the first polysilicon gate spacer;
the second region of photoresist is formed on a first lateral extent of the second polysilicon gate spacer and excludes a second lateral extent of the second polysilicon gate spacer;
the second lateral extent of the first polysilicon gate spacer shields a region of the active layer disposed below the first polysilicon gate spacer from dopants of the second conductivity type; and
the second lateral extent of the second polysilicon gate spacer shields a region of the active layer disposed below the second polysilicon gate spacer from the dopants of the second conductivity type.

15. The method of claim 11, further comprising:
forming a third polysilicon gate spacer on the active layer and laterally disposed next to an outer edge of the first gate polysilicon and vertically disposed above the first drift region; and
forming a fourth polysilicon gate spacer on the active layer and laterally disposed next to an outer edge of the second gate polysilicon and vertically disposed above the second drift region.

16. The method of claim 15, further comprising:
forming a first gate shield having a first portion that is disposed above the first gate polysilicon and a second portion that extends past the third polysilicon gate spacer on the outer edge of the first gate polysilicon, the second portion of the first gate shield being disposed above the first drift region and being closer to the active layer than the first portion of the first gate shield; and
forming a second gate shield having a first portion that is disposed above the second gate polysilicon and a second portion that extends past the fourth polysilicon gate spacer on the outer edge of the second gate polysilicon, the second portion of the second gate shield being disposed above the second drift region and being closer to the active layer than the first portion of the second gate shield.

17. The method of claim 16, further comprising:
forming a dielectric region on the active layer, on the first gate shield, and on the second gate shield; and
forming a metal source contact extending vertically from a top surface of the dielectric region to the source connection region, the metal source contact being laterally disposed between the first polysilicon gate spacer and the second polysilicon gate spacer.

18. The method of claim 17, wherein:
a first width of the metal source contact along a first vertical extent of the metal source contact is wider than a second width of the metal source contact along a second vertical extent of the metal source contact:
the first vertical extent of the metal source contact extends from a top surface of the first portion of the first gate shield to the top surface of the dielectric region;
the first width of the first vertical extent of the metal source contact laterally overlaps, and is in contact with, the first portion of the first gate shield; and
the second vertical extent of the metal source contact extends below the first gate shield.

19. A semiconductor device, comprising:
a semiconductor wafer having an active layer of a first conductivity type, the active layer comprising a deep well of a second conductivity type, a shallow well of the second conductivity type, a source region of the first conductivity type, a first channel region of the second conductivity type, a second channel region of the second conductivity type, a first drift region of the first conductivity type, a second drift region of the first conductivity type, a first drain region of the first conductivity type, a second drain region of the first conductivity type, and a source connection region of the second conductivity type;
first gate polysilicon formed above the active layer and having a first polysilicon gate spacer laterally disposed next to the first gate polysilicon;
second gate polysilicon formed above the active layer and having a second polysilicon gate spacer laterally disposed next to the second gate polysilicon, the source connection region being laterally disposed between the first polysilicon gate spacer and the second polysilicon gate spacer;
a first gate shield formed above the first gate polysilicon;
a second gate shield formed above the second gate polysilicon;
a dielectric region formed over the active layer; and a metal source contact extending vertically from a top surface of the dielectric region to the source connection region, the metal source contact being laterally disposed between the first polysilicon gate spacer and the second polysilicon gate spacer and having a first width along a first vertical extent of the metal source contact that is wider than a second width along a second vertical extent of the metal source contact, the first width of the first vertical extent of the metal source contact laterally overlapping, and being in contact with, the first gate shield.

* * * * *